(12) United States Patent
Okuno et al.

(10) Patent No.: US 6,705,177 B2
(45) Date of Patent: Mar. 16, 2004

(54) ROBOT ARM MECHANISM

(75) Inventors: Chohei Okuno, Ise (JP); Hiroki Mori, Tsu (JP); Tetsuya Watanabe, Tsu (JP)

(73) Assignee: Teijin Seiki Co., Ltd., Tokyo (JP)

( * ) Notice: Subject to any disclaimer, the term of this patent is extended or adjusted under 35 U.S.C. 154(b) by 83 days.

(21) Appl. No.: 10/115,098

(22) Filed: Apr. 4, 2002

(65) Prior Publication Data
US 2002/0144782 A1 Oct. 10, 2002

(30) Foreign Application Priority Data

Apr. 5, 2001 (JP) ........................................ 2001-107441
Jul. 24, 2001 (JP) ........................................ 2001-222488

(51) Int. Cl.[7] .............................................. B25J 17/00
(52) U.S. Cl. ................ 74/490.01; 74/490.03; 74/490.05; 414/744.5; 901/15
(58) Field of Search ................ 74/490.01, 490.03, 74/490.05; 414/744.5, 917; 901/15, 16, 23, 27, 28

(56) References Cited

U.S. PATENT DOCUMENTS

| 4,756,662 A | * | 7/1988 | Tanie et al. ................ 414/729 |
| 5,151,008 A | | 9/1992 | Ishida |
| 5,447,409 A | | 9/1995 | Grunes |
| 6,095,011 A | * | 8/2000 | Brog.ang.rdh ............ 74/490.03 |
| 6,336,374 B1 | * | 1/2002 | Brogardh et al. ........ 74/490.03 |
| 6,364,599 B1 | | 4/2002 | Suwa |
| 6,412,363 B1 | * | 7/2002 | Brog.ang.rdh ............ 74/490.05 |
| 6,558,107 B1 | * | 5/2003 | Okuno ..................... 414/744.5 |
| 2002/0114690 A1 | * | 8/2002 | Ishigame .................. 414/744.5 |

* cited by examiner

*Primary Examiner*—David Fenstermacher
(74) *Attorney, Agent, or Firm*—Venable LLP; Andrew C. Aitken

(57) ABSTRACT

A robot arm mechanism includes a handling member for supporting and handling an object, a robot arm made up of a plurality of links, and a robot arm driving mechanism for driving the robot arm to assume its contracted and extended position. The robot arm comprises first and second arm links, a link retaining mechanism pivotably retaining the first and second arm links and a link operating mechanism to operate one of the first and second arm links by a motion of the other of the first and second arm links. The link operating mechanism comprises a crank, a coupling link and a connecting link. The crank integrally connected to the coupling link is pivotably connected to one of the first and second arms and to the link retaining mechanism. The connecting link is pivotably connected to the other of the first and second arms. This leads to the advantage that the robot arms can be contracted and extended and rotated by only two electric motors.

21 Claims, 20 Drawing Sheets

ROBOT ARM MECHANISM

BACKGROUND OF THE INVENTION

1. Field of the Invention

The present invention relates to a robot arm mechanism having arms contracted and extended, and more particularly to a robot arm mechanism incorporating an arm driving mechanism for driving the arms to assume its contracted and extended positions.

2. Description of the Related Art

The robot arm mechanism of this type is used in the process of producing semiconductors in which the robot arm mechanism is operated to have arms contracted and extended to handle works, i.e., objects to be treated. These objects include for example such as wafers and other precision parts that are to be transferred and then unloaded onto a work table by the robot arm mechanism.

A conventional robot arm mechanism of this kind is disclosed in, for example, Japanese patent No.2808826 and comprises a handle member for holding and releasing objects, and robot arms for operating and moving the hand. The robot arms are constituted by a plurality of parallel links having pivotable joint portions on which are provided synchronous gears for maintaining the links in their parallel attitudes. The synchronous gears are rotated to have the hand maintained in its predetermined direction by moving the hand forwardly and rearwardly while the parallel links are operated. The parallel links are pivotably supported at their base portions by a rotating disc and driven to be contacted and extended by two electric motors through couplings and transfer shafts. The rotating disc is formed gear teeth around its side to mesh with a drive gear driven by another electric motor so as to rotate the robot arms.

Another conventional robot arm mechanism of this kind is disclosed in Japanese patent laying-open publication Tokkaihei 10-156770 and comprises robot arms constituted by a plurality of parallel links to form a first parallelogram linkage contractable and extensible, and a synchronous motion mechanism including gears, belts and pulleys operatively mounted on the links. The synchronous motion mechanism is operated to have gears, belts and pulleys driven so that the first parallelogram linkage can be contracted and extended. The parallel links are supported by a rotating disk and connected with a second parallelogram linkage driven by a first electric motor through a driving arm pivotably connected to the second parallelogram linkage to contract and extend the first parallelogram linkage. The first electric motor is positioned away from a rotation axis of the rotating disk. The rotating disk is driven by a second electric motor so as to rotate the robot arms.

A third conventional robot arm mechanism of this kind is disclosed in Japanese patent laying-open publication Tokkaihei 07-73833 and comprises robot arms constituted by four pivotably connected links to form a diamond-shaped linkage contractable and extensible, and a synchronous motion mechanism including gears, belts and pulleys operatively mounted on the links. The synchronous motion mechanism is operated to have gears, belts and pulleys driven so that the diamond-shaped linkage can be contracted and extended. The links has a pair of handling members and are pivotably connected to two driving arms supported by a center hub. The arms are driven clockwise or counterclockwise independently of each other around a rotation axis by two electric motors, which enable the diamond-shaped linkage to be contracted and extended.

The above known conventional robot arm mechanisms, however, encounter such problems as follows;

The above known first conventional robot arm mechanism requires three electric motors; two motors to drive the links for the purpose for contracting and extending the robot arms and one motor to drive the rotating disk for the purpose of rotating the robot arms, resulting in larger size and higher cost.

The above known second conventional robot arm mechanism has a limit of a rotation angle of the robot arms, for the electric motor for contracting and extending the arms has to be arranged away from the rotation axis of the rotating disk and moved around it. To avoid the above limit of rotation, it takes a high cost and a complex structure, for such a device as brush electric contact mechanism has to be added.

The above known third conventional robot arm mechanism has such a problem that the diamond-shaped linkage can not bring the handling members beyond the rotation axis and is equipped with such long links that they may interfere other parts of the robot arm mechanism.

It is, therefore, an object of the present invention to provide a robot arm mechanism which overcomes the foregoing drawbacks and can drive the robot arms to assume its contracted and extended positions and to rotate without a limit of a rotation angle by only two motors.

It is another object of the present invention to provide a robot arm mechanism with a simple construction.

SUMMARY OF THE INVENTION

According to the first aspect of the present invention there is provided a robot arm mechanism comprising: a plurality of handling members for supporting and handling an object, the plurality of handling members comprising a first handling member and a second handling member, a robot arm connected to the handling members, the robot arm comprising a first arm link having first and second end portions and a first pivotable joint portion between the first and second end portions of the first arm link, a second arm link having first and second end portions and a first pivotable joint portion between the first and second end portions of the second arm link, the first and second arm links respectively rotatable around a rotation axis, a link retaining mechanism for retaining attitudes of the first and second handling members, a link operating mechanism for operating the link retaining mechanism according to a rotation angle between the first and second arm links, the link operating mechanism comprising a lever member pivotably connected with the link retaining mechanism, the lever member comprising a crank and a coupling link respectively having first and second end portions, the crank pivotably connected at the first end of the crank with one of the first and second arm links, the crank integrally connected to the coupling link, the link operating mechanism further comprising a connecting link having first and second end portions, the connecting link pivotably connected at the first end portion of the connecting link to the other of the first and second arm links, the connecting link and the coupling link pivotably connected with each other at the second end portion of the connecting link and the second end portion of the coupling link, a robot arm driving mechanism for driving the robot arm, the robot arm driving mechanism comprising a first driving shaft and a second driving shaft.

BRIEF DESCRIPTION OF THE DRAWINGS

The objects, features and advantages of the present invention will become apparent as the description proceeds when taken in conjunction with the accompanying drawings, in which.

DESCRIPTION OF THE PREFERRED EMBODIMENTS

Figure 1:
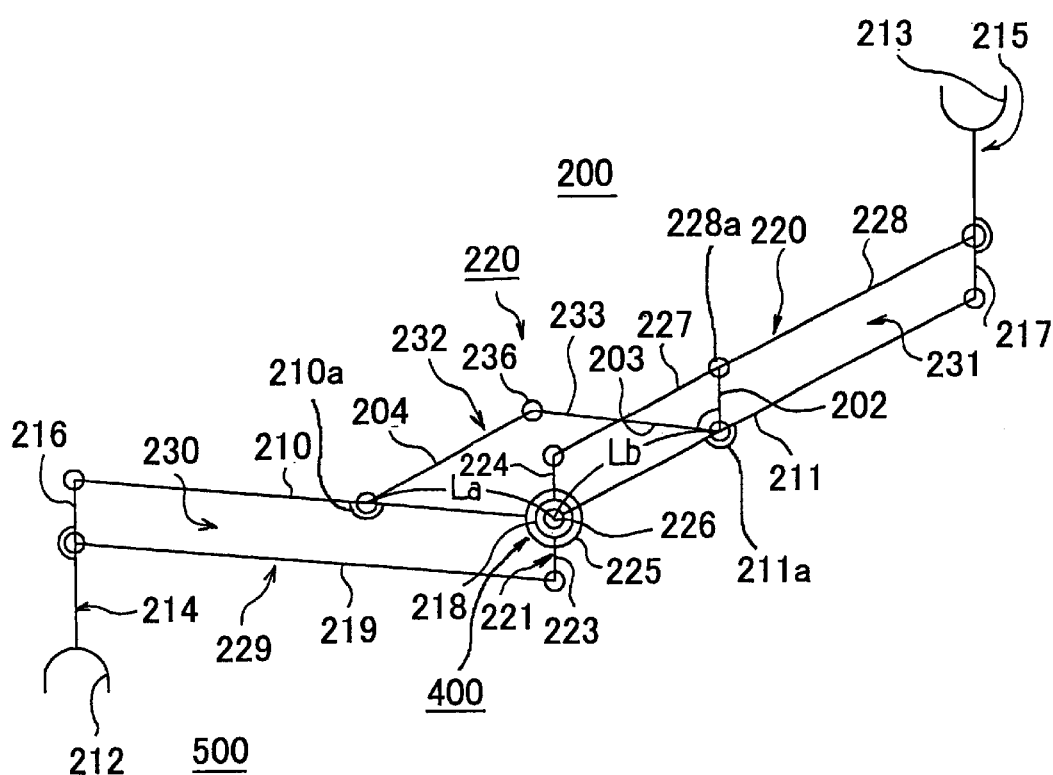
FIG. 1 is a skeleton view of one condition of the first preferred embodiment of the robot arm mechanism according to the present invention.

Throughout the following detailed description, similar reference characters and numbers refer to similar elements in all Figures of the drawings.

Referring to FIGS. 1 to 4 of the drawings, there is shown a first preferred embodiment of the robot arm mechanism according to the present invention. The robot arm mechanism 200 is shown in FIGS. 1 to 4 as comprising a first and second handling members 214 and 215 respectively for supporting and handling an object.

The first and second handling members 214 and 215 should be configured to be available for handling, i.e., holding and releasing a wafer and other materials to be used for producing semiconductors. The first and second handling members 214 and 215 respectively have first and second end portions and are formed at the first end portions of the handling members 214 and 215 with recesses 212 and 213 which are designed suitably to receive and release such materials. The configuration of the first and second handling members 214 and 215 depend upon the sizes and shapes of the materials to be handled by the first and second handling members 214 and 215 according to the present invention.

The robot arm mechanism 200 further comprises a robot arm 220 connected to the handling members 214 and 215. The robot arm 220 comprises a first arm link 210, and a second arm 211 respectively having first and second end portions and rotatable around a rotation axis 298.

The first arm link 210 further has a first pivotable joint portion 210a positioned between the first and second end portions of the first arm link 210 at a distance La away from the rotation axis 298. The second arm link 211 further has a pivotable joint portion 211a positioned between the first and second end portions of the second arm link 211 at a distance Lb away from the rotation axis 298.

The robot arm 220 further comprises a link retaining mechanism 229 including a first and second link retaining mechanisms 230 and 231 to retain attitudes of the handling members 214 and 215.

The link retaining mechanisms 229 further comprise a joint cross link 221 including a first joint link 223 for the first link retaining mechanism 230 and the second joint link 224 for the second link retaining mechanism respectively having first and second end portions and substantially equal in length to each other.

The joint cross link 221 further comprises a joint shaft 201 having first and second side portions opposite to each other with respect with the rotation axis 298. The joint shaft 201 and the first joint link 223 are integrally connected with each other at the first side portion of the joint shaft 201 and the first end portion of the first joint link 223. The joint shaft 201 and the second joint link 224 are integrally connected with each other at the second side portion of the joint shaft 201 and the first end portion of the second joint link 224.

The first link retaining mechanism 230 further comprises a first retainer link 219 having first and second end portions and substantially equal in length to the first arm link 210. The first retainer link 219 and the first joint link 223 are pivotably connected with each other at the first end potion of the first retainer link 219 and the second end portion of the first joint link 223.

The first link retaining mechanism 210 further comprises a first output link 216 having first and second end portions and substantially equal in length to the first joint link 223. The first output link 216 and the first arm link 210 are pivotably connected with each other at the first end portion of the output link 216 and the second end portion of the first arm link 210. The first output link 216 and the first retainer link 219 are pivotably connected with each other at the second end portion of the first output link 216 and the second end portion of the first retainer link 219. The first output link 216 and the first handling member 214 are integrally connected with each other at the second end portion of the first output link 216 and the second end portion of the first handling member 214.

The first arm link 210, the first retainer link 219, the first joint link 223 and the first output shaft 216 form a parallelogram linkage, which always keeps the first joint link 223 and the first joint link 223 in parallel relationships with each other by the first arm link 210 and the first retainer link 219. This results in the fact that the first output link 216 always keeps the first handling member 214 in parallel relationships with the joint cross link 221.

The second link retaining mechanism 231 comprises a second retainer link 228 substantially equal in length to the second arm link 211 and having first and second end portions, and a pivotable joint portion 228a positioned between the first and second end portions of the second retainer link 228 at a distance Lb away from the first end portion of the second retainer link 228. The second retainer link 211 and the second joint link 224 are pivotably connected with each other at the first end portion of the second retainer link 211 and the second end portion of the second joint link 224.

The second link retaining mechanism 231 further comprises a second output link 217 having first and second end portions and substantially equal in length to the second joint link 224. The second output link 217 and the second arm link 211 are pivotably connected with each other at the first end portion of the second output link 217 and the second end portion of the second arm link 211. The second output link 217 and the second retainer link 228 are pivotably connected with each other at the second end portion of the second output link 217 and the second end portion of the second retainer link 228. The second output shaft 217 and the second handling member 215 are integrally connected with each other at the second end portion of the second output shaft 217 and the second end portion of the second handling member 215.

The second arm link 211, the second retainer link 228, the second joint link 224 and the second output shaft 217 form a parallelogram linkage, which always keeps the second output link 217 and the second joint link 224 in parallel relationships with each other by the second arm link 211 and the second retainer link 228. This results in the fact that the second output link 217 always keeps the second handling member 215 in parallel relationships with the joint cross link 221.

The robot arm 220 further comprises a link operating mechanism 232 which operates one of the first and second arm links 210 and 211 by a motion of the other of the first and second arm links 210 and 211.

The link operating mechanism 232 comprises a lever member 233 formed in a shape of a capital L including a crank 202 and a coupling link 203 respectively having first and second end portions. The crank 202 is substantially equal in length to the second output link 217. The coupling link 203 is longer than the crank 202.

The link operating mechanism 232 further comprises a connecting link 204 respectively having first and second end portions. The connecting link 204 is longer than the crank 202.

The crank 202 and the coupling link 203 are integrally connected with each other at the first end portion of the crank 202 and the first end portion of the coupling link 203. The crank 202 and the second retainer link 228 are pivotably connected with each other at the second end portion of the crank 202 and the pivotable joint portion 228a of the second retainer link 228. The crank 202 and the second arm link 211 are pivotably connected with each other at the first end portion of the crank 202 and the first pivotable joint portion 211a of the second arm link 211.

The coupling link 203 and the connecting link 204 are pivotably connected by a pivotable joint 236 with each other at the second end portion of the coupling link 203 and the second end portion of the connecting link 204 under the state that the coupling link 203 is crossed with the second retainer link 228 and the second joint link 224.

The connecting link 204 and the first arm link 210 are pivotably connected with each other at the first end portion of the connecting link 204 and the first pivotable joint portion 210a of the first arm link 210.

In the link operating mechanism 232, the sum of the lengths of the coupling link 203 and the connecting link 204 is designed greater than La+Lb, the sum of the lengths between the rotation axis 298 and the first pivotable joint portions 210a and 211a of the first and second arm links 210 and 211, which ensures the link operating mechanism 232 the stability of motion without a change point.

The robot arm mechanism 200 further comprises a robot arm driving mechanism 400 including a first and second driving shafts 225 and 226 rotatable around the rotation axis 298.

The first driving shaft 225 is formed with a hollow along the rotation axis 298 to rotatably receive therein the second driving shaft 226 in coaxial relationship with the first driving shaft 225.

The first driving shaft 225 is integrally connected to the first end portion of the first arm link 210 and is driven by an electric motor, not shown, to rotate the first arm link 210 around the rotation axis 298. The second driving shaft 226 is integrally connected to the first end portion of the second arm link 211 and is driven by another electric motor, not shown, to rotate the second arm link 211 around the rotation axis 298 independently of the first arm link 210.

The operation of the above robot arm mechanism 200 of the first preferred embodiment is as follows.

Figure 2:
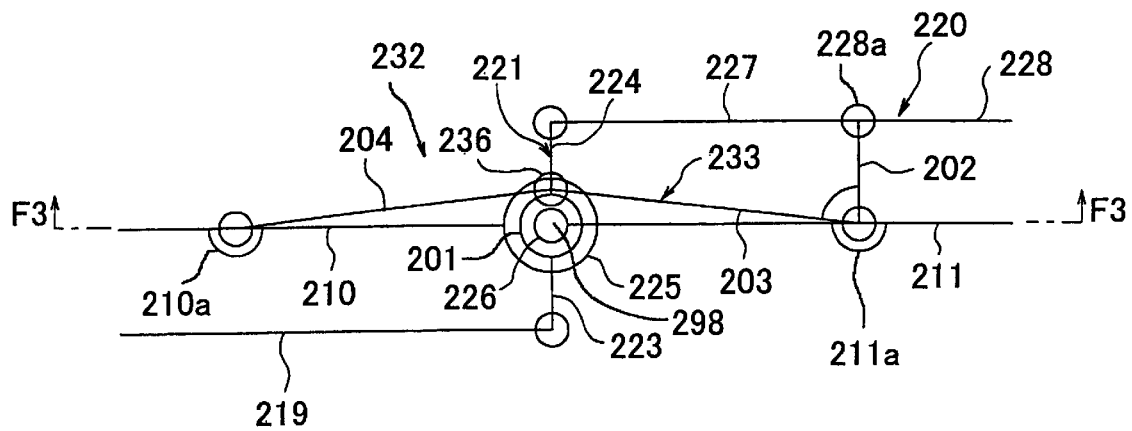
FIG. 2 is an enlarged fragmentary skeleton view of another condition of the robot arm mechanism shown in FIG. 1 according to the present invention.
Figure 3:
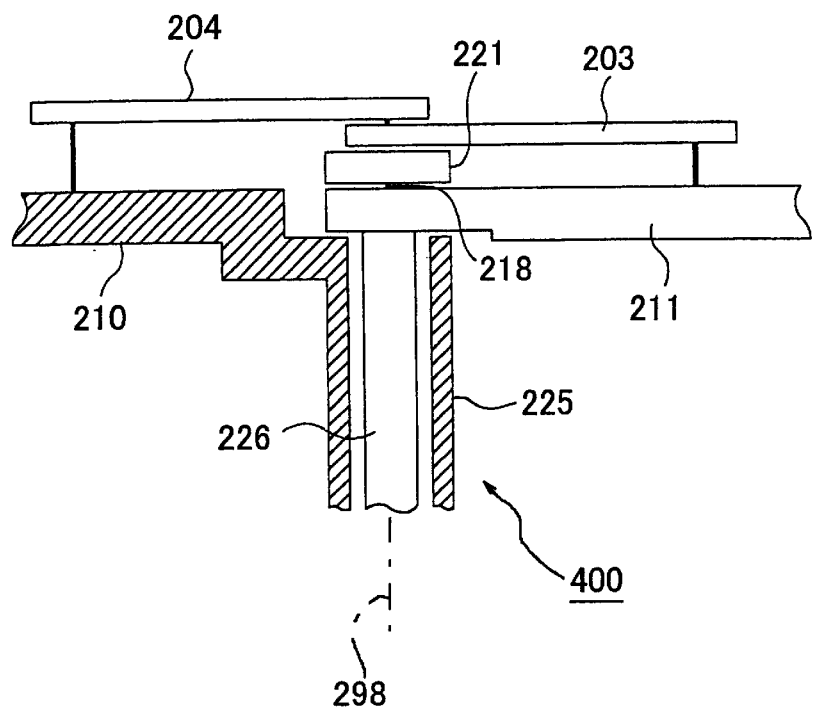
FIG. 3 is a cross-sectional view taken on the lines F3—F3 in FIG. 2.
Figure 4:
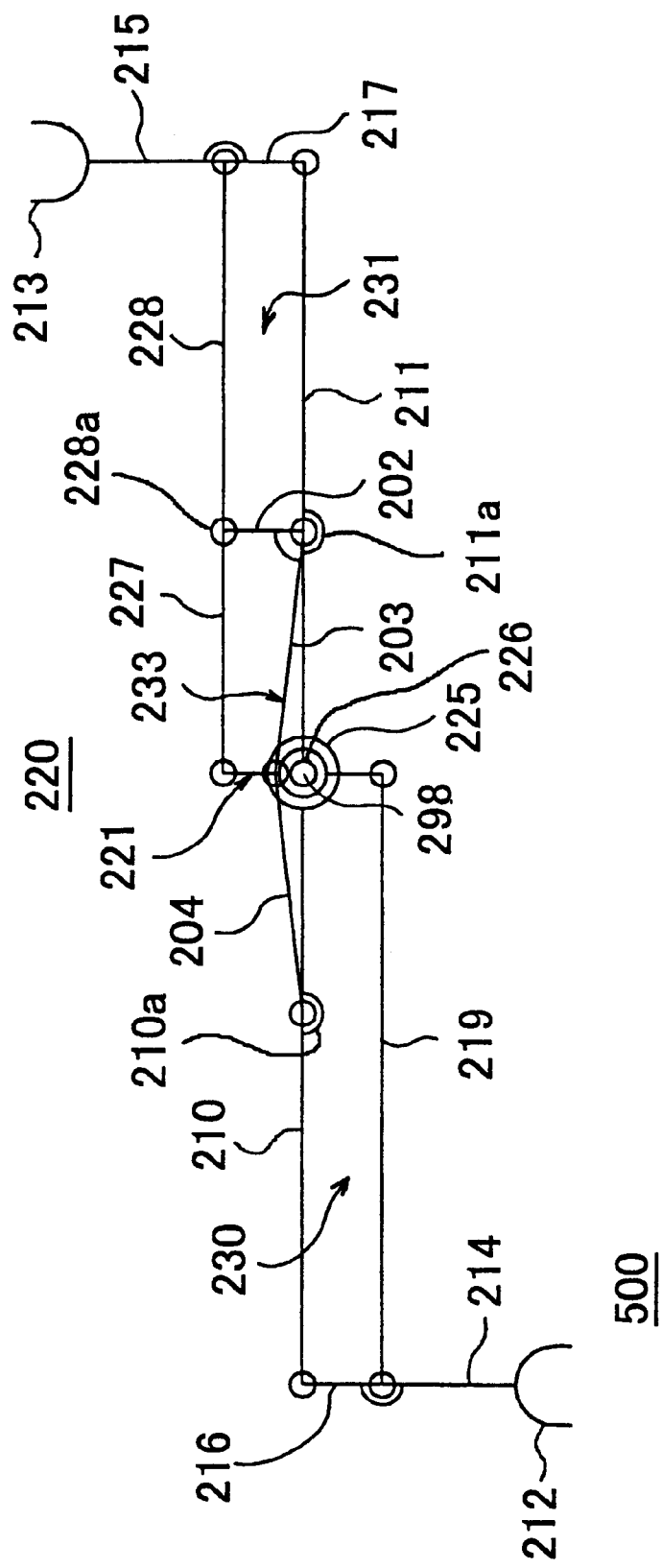
FIG. 4 is a skeleton view of the condition shown in FIG. 2 of the first preferred embodiment of the robot arm mechanism according to the present invention.

When the first and second handling members 214 and 215 are at a home position, the first and second arm links 210 and 211 are placed at the positions shown in FIGS. 2 and 4. When the first and second arm links 210 and 211 rotates to the position shown in FIG. 1 from the home position, the first driving shaft 224 rotates the first arm 210 to be rotated clockwise for moving the first handling member 214 backward, and the second driving shaft 226 drives the second arm link 211 to be rotated counterclockwise, for moving the second handling member 215 forward.

The first and second handling members 214 and 215 are kept in parallel relationship with the first and second joint link 224 and 225 during their moving by the parallelogram linkage of the first and second link retaining mechanism 230 and 231 including the first and second arm links 210 and 211, the first and second retainer links 219 and 228, the first and second joint links 223 and 224, and the first and second output links 216 and 217.

The rotations of the first and second arm links 210 and 211 respectively rotates the crank 202 and the connecting link 237 of the link operating mechanism 232. The crank 202 and the coupling link 203 are rotated clockwise around the first pivotable portion 221a of the second arm link 211. The connecting link is rotated counterclockwise around the first pivotable portion 210a of the first arm link 210.

The rotation movement of the crank 202 and the rotation movement of the connecting link 204 effect the pivotable joint 236 connecting the coupling link 203 and the connecting link 204 so that the first and second output shafts 216 and 217 and the first and second joint links 223 and 224 are always in parallel relationship with each other.

Figure 5:
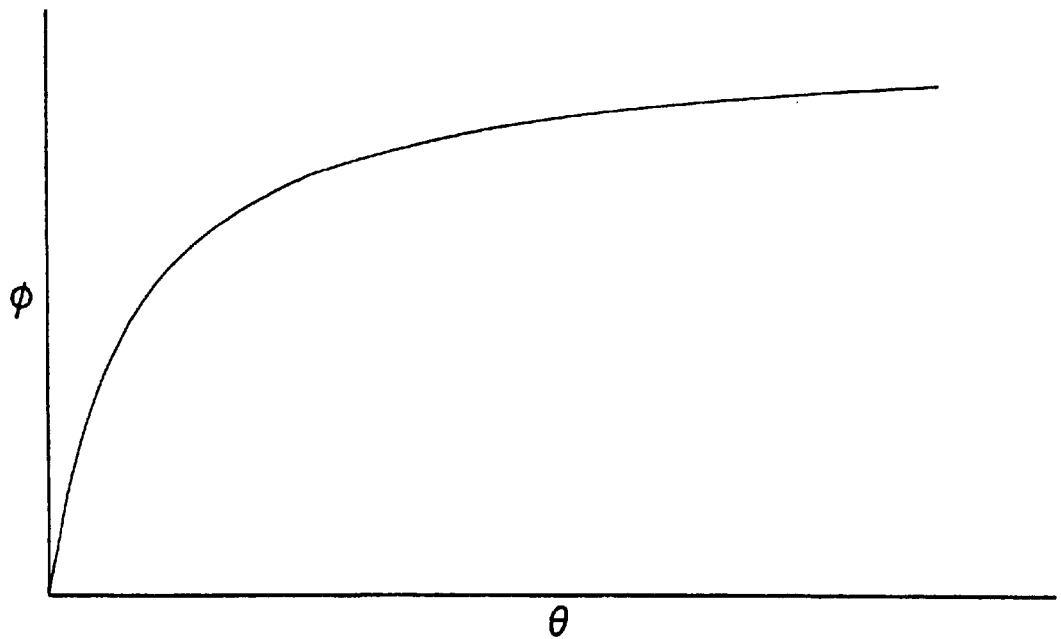
FIG. 5 is a graph that shows a relationship of rotation angles between the first and the second arm links.
Figure 6:
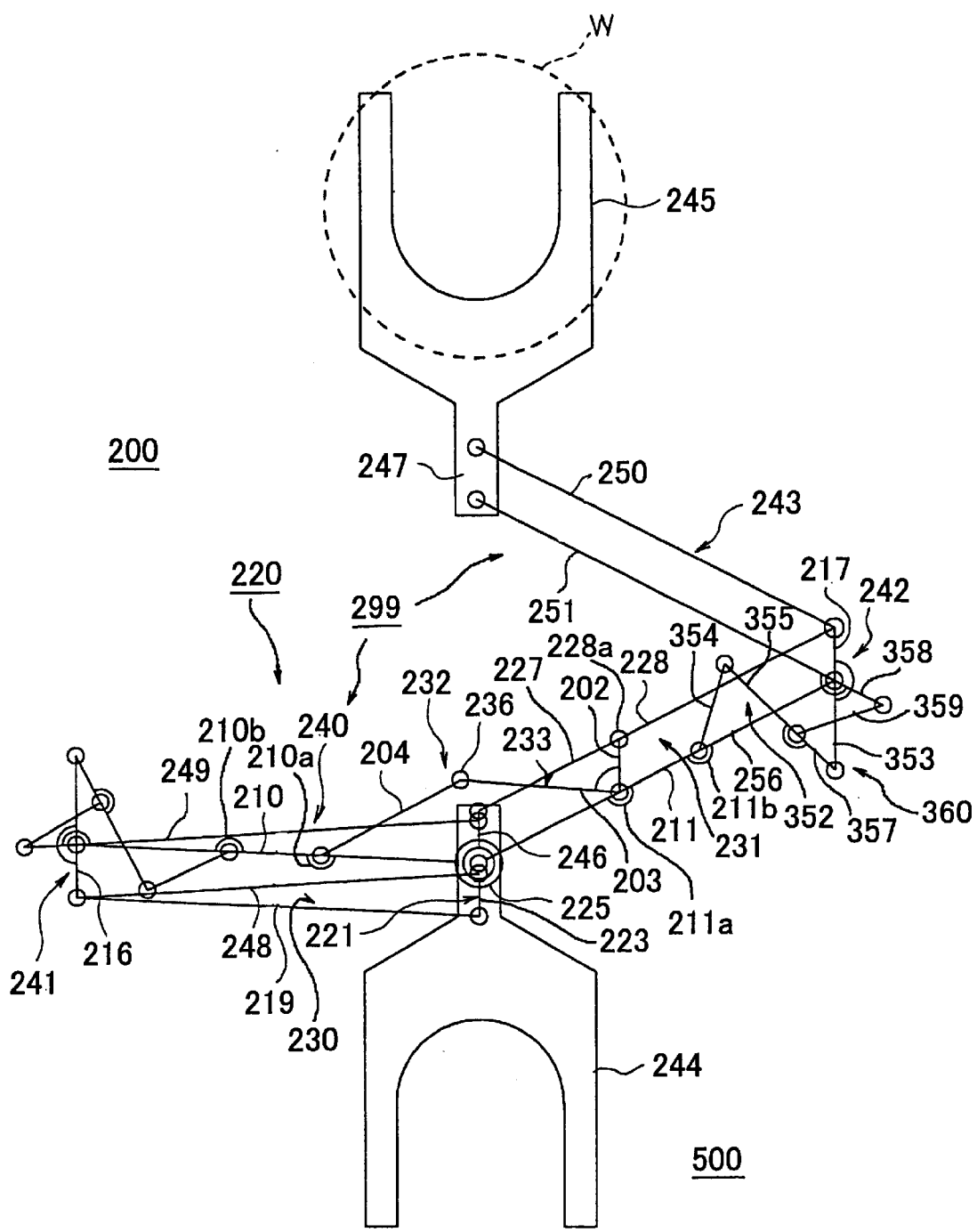
FIG. 6 is a skeleton view of one condition of the second preferred embodiment of the robot arm mechanism according to the present invention.
Figure 7:
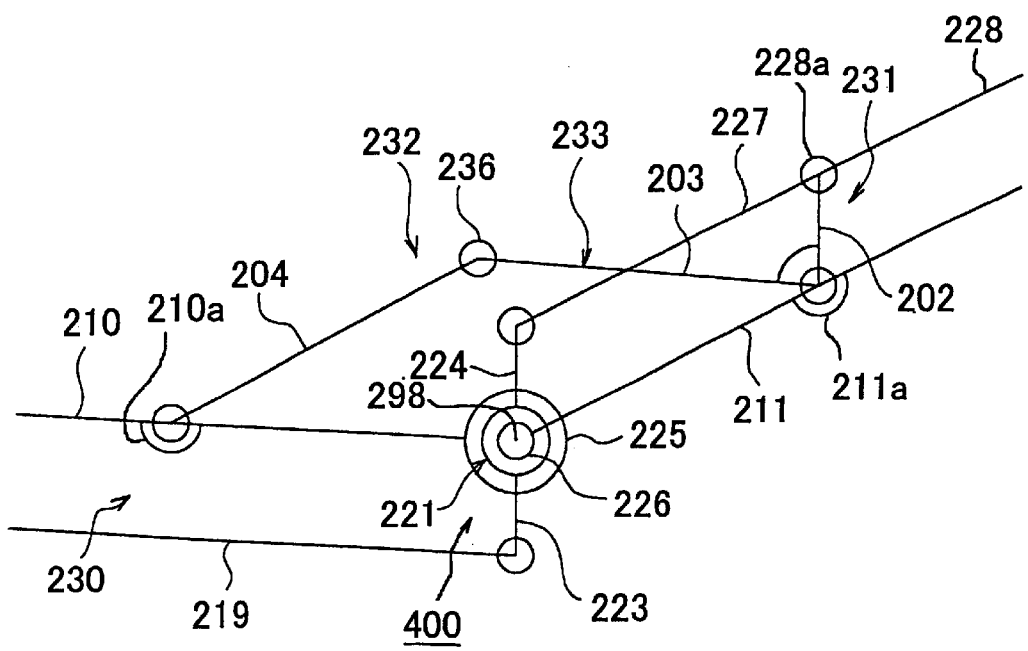
FIG. 7 is an enlarged fragmentary skeleton view of the robot arm mechanism shown in FIG. 6 according to the present invention.
Figure 8:
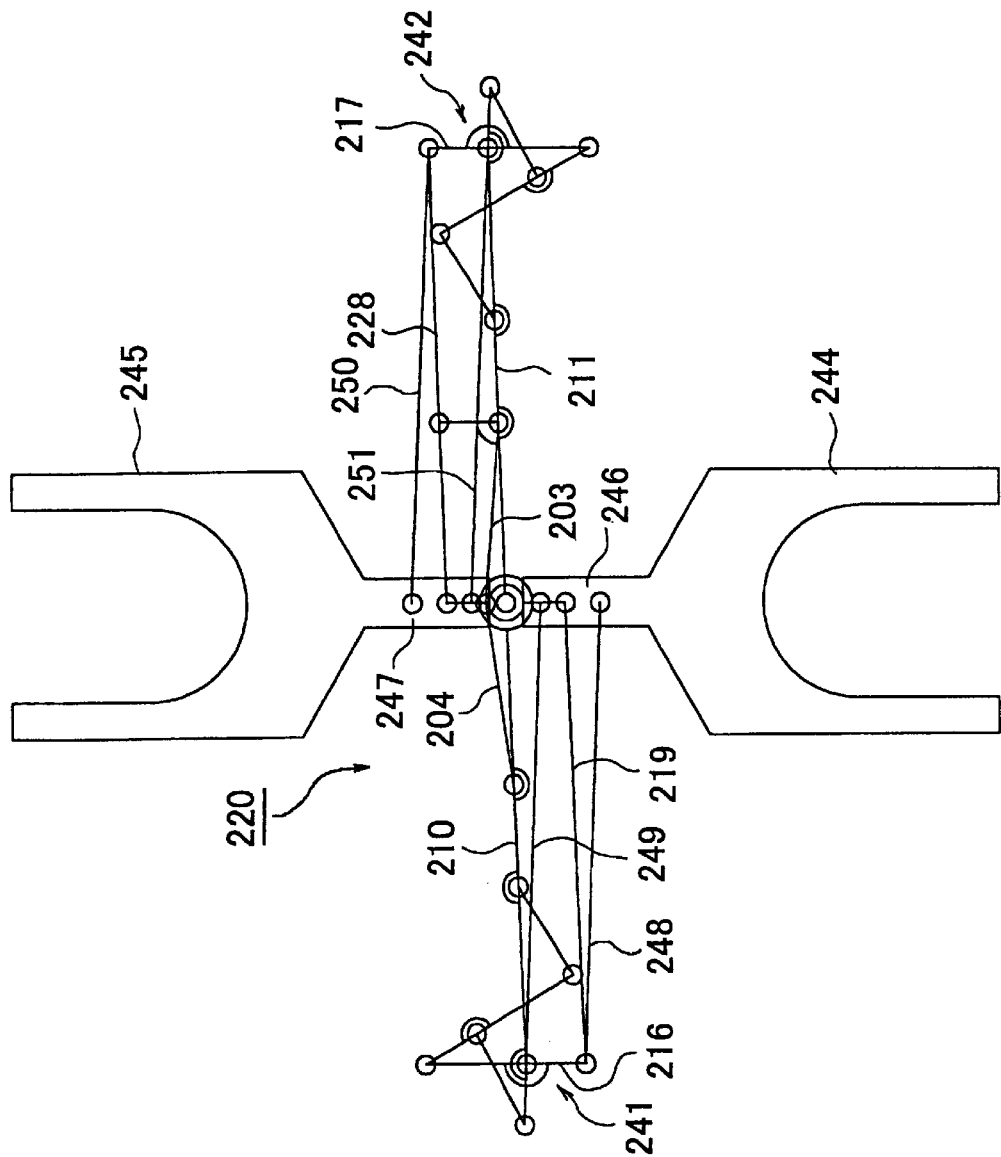
FIG. 8 is a skeleton view of another condition of the second preferred embodiment of the robot arm mechanism according to the present invention.
Figure 9:
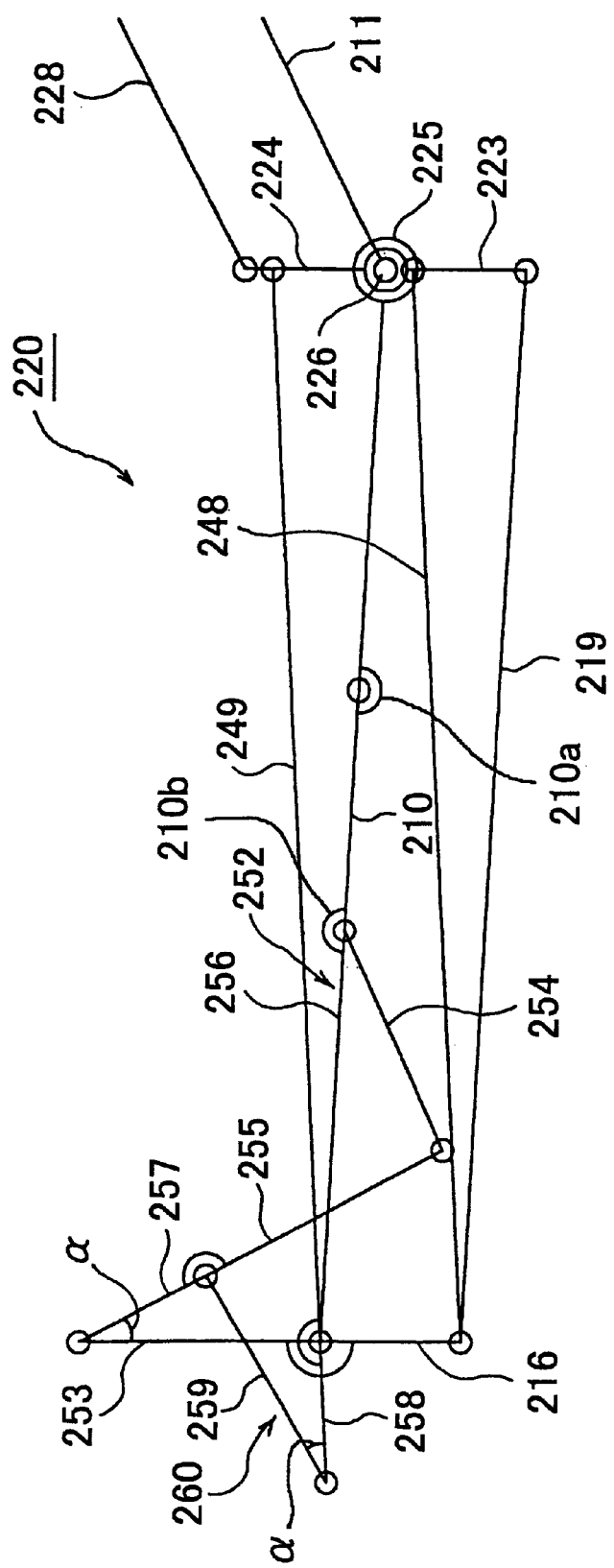
FIG. 9 is an enlarged fragmentary skeleton view of the robot arm mechanism shown in FIG. 6 according to the present invention.
Figure 10:
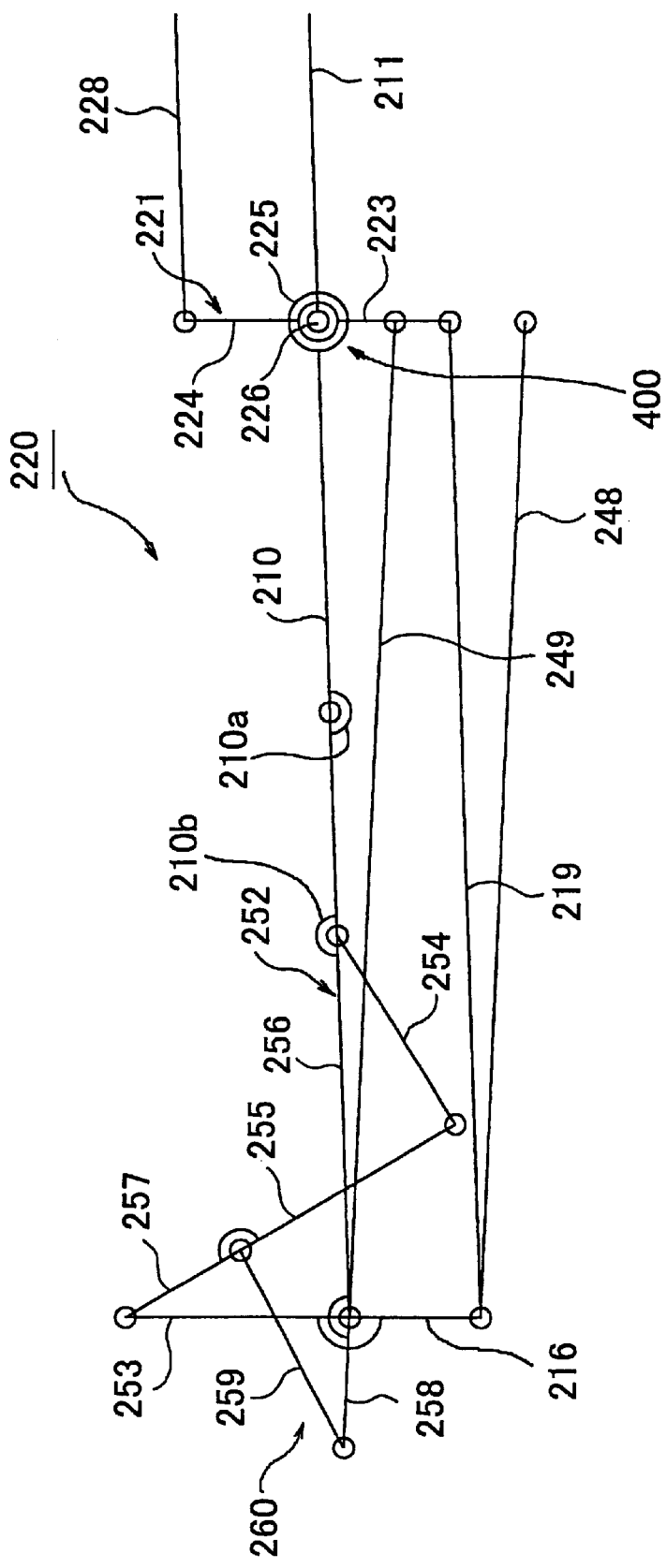
FIG. 10 is an enlarged fragmentary skeleton view of the robot arm mechanism shown in FIG. 8 according to the present invention.

The first and second driving shafts 225 and 226 are controlled so that a rotation angle of the first arm link 210 is greater than that of the second arm link 211. FIG. 5 shows a relationship of a rotation angles Φ of the first arm link 210 driven by the first driving shaft 225 and a rotation angles θ of the first arm link 210 driven by the first driving shaft 225. This means that forward moving travel of the first and second handling members 214 and 215 is greater than backward moving travel of those. This brings a good space utility. The above relation between the rotation angles are memorized in a memory of a robot arm controller as a data table of the relation between the rotation angles of the first and second arm links 210 and 211.

When the first and the second driving shafts 225 and 226 drive the first and second arm links 210 and 211 at the same speed and in the same rotation direction, the first and second arm links 210 and 211 are rotated together around the rotation axis 298 under the state such that the first and second arm links 210 and 211 are united together. Therefore it is not necessary to provide with another electric motor to rotate the first and second arm links 210 and 211. It is not necessary to rotate a robot-arm supporting disk to rotate the first and second arm links 210 and 211. This results in the fact that the robot arm mechanism 200 according to the first embodiment of the present invention enables its construction simpler.

Referring to FIGS. 6 to 10 of the drawings, there is shown a second preferred embodiment of the robot arm mechanism according to the present invention. The robot arm mechanism 200 is shown in FIGS. 6 to 10 as comprising a first and second handling members 244 and 245 for respectively supporting and handling an object W and respectively having first and second end portions. The first and second handling members are integrally connected to a first and second handling support links 246 and 247 respectively having first and second end portions.

The robot arm 220 further comprises a first and second arm links 210 and 211 having first and second end portions and similar to the first and second arm links 210 and 211 of the first preferred embodiment of the robot arm mechanism according to the present invention, except the fact that the first arm link 210 has a first and second pivotable joint portions 210a and 210b between the first and the second end portions of the first arm link 210 and that the second arm link 211 has a first and second pivotable joint portions 211a and 211b between the first and the second end portions of the second arm link 211. The second pivotable joint portion 210b of the first arm link 210 is positioned between the first pivaotable joint portion 210a and the second end portion of the first arm link 210. The second pivotable joint portion 211b of the second arm link 211 is positioned between the first pivaotable joint portion 211a and the second end portion of the second arm link 211.

The robot arm 220 further comprises a link retaining mechanism 232 which includes a first and second link retaining mechanisms 230 and 231 and a link operating mechanism 232 which are respectively similar to the link retaining mechanism 232, the first and second link retaining mechanisms 230 and 231 and the link operating mechanism 232 of the first preferred embodiment of the robot arm mechanism according to the present invention.

The first link retaining mechanism 230 comprises a first retainer link 219, a first joint link 223, and a first output link 216 which are respectively similar to the first retainer link 219, the first joint link 223, and the first output link 216 of the first preferred embodiment of the robot arm mechanism according to the present invention.

The second link retaining mechanism 231 comprises a second retainer link 228, a second joint link 224, and a second output link 217 which are respectively similar to the second retainer link 228, the second joint link 224, and the second output link 217 of the first preferred embodiment of the robot arm mechanism according to the present invention.

The link operating mechanism 232 comprises a lever member 233 including a crank 202 and a coupling link 203, and a connecting link 204 which are respectively similar to the lever member 233, the crank 202, the coupling link 203, and the connecting link 204 of the first preferred embodiment of the robot arm mechanism according to the present invention.

The robot arm 220 further comprises an additional arm linkage 299 including a first additional arm linkage 240 pivotably connected to the first arm link 210 and the first retainer link 219, and a second additional arm linkage 243 pivotably connected to the second arm link 211 and the second retainer linkage 228.

The first additional linkage 240 comprises a third and fourth arm links 248 and 249 substantially equal in length to each other and respectively having first and second end portions. The second additional linkage 243 comprises a fifth and sixth arm links 250 and 251 substantially equal in length to each other and respectively having first and second end portions. The length between the first and second end portions of the first handling support link 246 is substantially equal in length to the first output link 216. The length between the first and second end portions of the second handling support link 247 is substantially equal in length to the second output link 217.

The third arm link 249 and the first handling support link 246 are pivotably connected with each other at the first end portion of the third arm link 248 and the first end portion of the first handling support link 246. The third arm link 249 and the first arm link 210 are pivotably connected with each other at the second end portion of the third arm link 249 and the second end portion of the first arm link 210 under the state that the third arm link 249 can be crossed with the first arm link 210 and the first retainer link 219. The third arm link 249 and the first output link 216 are pivotably connected with each other at the second end portion of the third arm link 249 and the first end portion of the first output link 216. The third arm link 249 and the fourth arm link 248 pivotably retain the first output link 216 and the first handling support link 246 in parallel relationship with each other.

The fourth arm link 248 and the first handling support link 246 are pivotably connected with each other at the first end portion of the fourth arm link 248 and the second end portion of the first handling support link 246. The fourth arm link 248 and the first retainer link 219 are pivotably connected with each other at the second end of the fourth arm link 248 and the second end portion of the first retainer link 219 under the state that the fourth arm link 248 can be crossed with the first arm link 210 and the first retainer link 219. The fourth arm link 248 and the first output link 216 are pivotably connected with each other at the second end portion of the fourth arm link 248 and the second end portion of the first output link 216.

The fifth arm link 251 and the second handling support link 246 are pivotably connected with each other at the first end portion of the fifth arm link 251 and the first end portion of the second handling support link 247. The fifth arm link 251 and the second arm link 211 are pivotably connected with each other at the second end of the fifth arm link 251 and the second end portion of the second arm link 211 under the state that the fifth arm link 250 can be crossed with the second arm link 211 and the second retainer link 228. The fifth arm link 251 and the second output link 217 are pivotably connected with each other at the second end portion of the fifth arm link 251 and the first end portion of the second output link 217. The fifth arm link 251 and the sixth arm link 250 pivotably retain the second output link 217 and the second supporting link 247 in parallel relationship with each other.

The sixth arm link 250 and the second handling support link 246 are pivotably connected with each other at the first end portion of the sixth arm link 250 and the first end portion of the second handling support link 247. The sixth arm link 250 and the second retainer link 228 are pivotably connected with each other at the second end portion of the sixth arm link 250 and the second end portion of the second retainer link 250 under the state that the sixth arm link 250 can be crossed with the second arm link 211 and the second retainer link 228.

The sixth arm link 250 and the second output link 217 are pivotably connected with each other at the second end portion of the sixth arm link 251 and the second end portion of the second output link 217.

The first arm link 210, the first output link 216 and the third arm link 249 are pivotably connected with each other by a first synchronous mechanism 241.

The first synchronous mechanism 241 comprises a first double crank mechanism 252 including a first link 253, a second link 254, a third link 255, and a fourth link 256 respectively having first and second end portions.

The first synchronous mechanism 241 further comprises a second double crank mechanism 260 including a fifth link 257, a sixth link 258, and a seventh link 259 respectively having first and second end portions.

The first double crank mechanism 252 is similar in figure to the second double crank mechanism 261 except for working in the reverse direction.

The first and second links 253 and 254 are substantially equal in length to each other. The third link 255 is longer than the first and second links 253 and 254. The fourth link 256 is a part of the first arm link 210 from the second end portion of the first arm link 210 to the second pivotable joint portion 210b. The fifth link 257 and the sixth link 258 are equal in length to each other.

The first link 253 and the first output link 216 are integrally connected with each other at the first end portion of the first link 253 and the first end portion of the first output link 216. The first link 253 and the fourth link 256 are pivotably connected with each other at the first end portion of the first link 253 and the first end portion of the fourth link 256. The first link 253 and the fifth link 257 are pivotably connected with each other at the second end portion of the first link 253 and the first end portion of the fifth link 257 at an acute angle of α from each other.

The second link 254 and the first arm link 210 are pivotably connected with each other at the first end portion of the second link 254 and the second pivotable joint portion 210b of the first arm link 210. The second link 254 and the third link 255 are pivotably connected with each other at the second end portion of the second link 254 and the first end portion of the third link 255.

The third link 255 and the fifth link 257 are integrally connected with each other at the second end portion of the third link 255 and the second end portion of the fifth link 257 under the state that the third link 255 is crossed with the first arm link 210, the first retainer link 219, the third link 249 and the fourth arm link 248. The third link 255 and the seventh link 259 are pivotably connected with each other at the second end portion of the third link 255 and the first end portion of the seventh link 259.

The fourth link 256 and the first output link 216 are pivotably connected with each other at the second end portion of the fourth link 256 and the first end portion of the first output link 216. The fourth link 256 and the sixth link 258 are pivotably connected with each other at the second end portion of the fourth link 256 and the first end portion of the sixth link 258.

The sixth link 258 and the seventh link 259 are pivotably connected with each other at the second end portion of the sixth link 258 and the second end portion of the seventh link 259 at an angle of α from each other under the state that the seventh link 259 is crossed with the first link 253.

The second synchronous mechanism 242 comprises a second double crank mechanism 352 including a eighth link 353, a ninth link 354, a tenth link 355, and a eleventh link 356 respectively having first and second end portions.

The second synchronous mechanism 242 further comprises a fourth double crank mechanism 360 including a twelfth link 357, a thirteenth link 358, and a fourteenth link 359 respectively having first and second end portions. The twelfth link 357 and the thirteenth link 358 are equal in length to each other.

The eighth and ninth link 233 and 354 are substantially equal in length to each other. The tenth link 355 is longer than the eighth and ninth link 353 and 354. The eleventh link 356 is a part of the second arm link 211 from the second end portion of the second arm link 211 to the second pivotable joint portion 211b. The twelfth link 357 and the thirteenth link 358 are equal in length to each other.

The eighth link 353 and the second output link 217 are integrally connected with each other at the first end portion of the eighth link 353 and the first end portion of the second output link 217. The eighth link 353 and the eleventh link 356 are pivotably connected with each other at the first end portion of the eighth link 353 and the first end portion of the eleventh link 356. The eighth link 353 and the twelfth link 358 are pivotably connected with each other at the second end portion of the eighth link 353 and the first end portion of the twelfth link 357 at an acute angle of α from each other.

The ninth link 354 and the second arm link 211 are pivotably connected with each other at the first end portion of the ninth link 354 and the second pivotable joint portion 211b of the second arm link 211. The ninth link 354 and the tenth link 355 are pivotably connected with each other at the second end portion of the ninth link 354 and the first end portion of the tenth link 355.

The tenth link 355 and the twelfth link 357 are integrally connected with each other at the second end portion of the tenth link 355 and the second end portion of the twelfth link 357 under the state that the tenth link 355 is crossed with the second arm link 211, the second retainer link 228, the tenth link 349 and the eleventh link 348.

The tenth link 355 and the fourteenth link 359 are pivotably connected with each other at the second end portion of the tenth link 355 and the first end portion of the fourteenth link 359.

The eleventh link 356 and the second output link 217 are pivotably connected with each other at the second end portion of the eleventh link 356 and the first end portion of the second output link 217. The eleventh link 356 and the thirteenth link 358 are pivotably connected with each other at the second end portion of the eleventh link 356 and the first end portion of the thirteenth link 358.

The thirteenth link 358 and the fourteenth link 359 are pivotably connected with each other at the second end portion of the thirteenth link 358 and the second end portion of the fourteenth link 359 at an angle of α from each other under the state that fourteenth link 359 is crossed with the eighth link 353.

According to the present invention, the synchronous mechanism may be replaced by known synchronous gears or belt pulleys for maintaining the additional arm links 248 and 249, 250 and 251 instead of the double crank mechanisms 252, 260, 352 and 360.

The additional arm linkages bring longer travel of the first and second arm links 210 and 211 without a large radius of rotating the robot arms 220 in addition to the advantages of the first embodiment according to the present invention.

Figure 11:
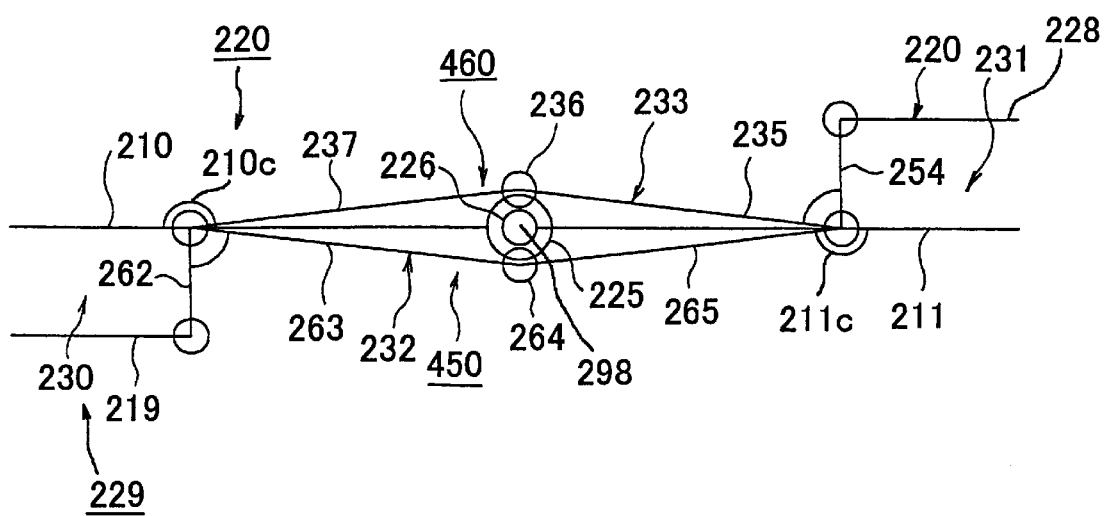
FIG. 11 is an enlarged fragmentary skeleton view of one the third preferred embodiment of the robot arm mechanism according to the present invention.

Referring to FIG. 11 of the drawing, there is shown a third preferred embodiment of the robot arm mechanism according to the present invention. The robot arm 220 is shown in FIG. 11 as comprising a first and second arms 210 and 211 having first and second end portions and similar to the first and second arm links 210 and 211 of the first preferred embodiment of the robot arm mechanism according to the present invention, except the fact that the first arm link 210 has a third pivotable joint portion 210c between the first and the second end portions of the first arm link 210 and that the second arm link 211 has a third pivotable joint portion 211c between the first and the second end portions of the second arm link 211.

A first driving shaft 225 is formed with a hollow along the rotation axis 298 to rotatably receive therein a second driving shaft 226 in coaxial relationship with the first driving shaft 225.

The robot arm 220 further comprises a link retaining mechanism 232 including a first and second link retaining mechanisms 230 and 231, and a first and second link operating mechanism 450 and 460.

The first arm link 210 is integrally connected at the first end portion to a first driving shaft 225 to be rotated clockwise or counterclockwise around a rotation axis 298. The second arm link 211 is integrally connected at the first end portion to a second driving shaft 226 to be rotated clockwise or counterclockwise around the rotation axis 298.

The first link retaining mechanism 230 further comprises a first retainer link 219 and a first crank 262 respectively having first and second end portions. The first retainer link 219 is substantially equal in length to the length from the third pivotable joint portion 210c to the second end portion of the first arm link 210.

The first crank 262 and the first arm link 210 are pivotably connected with each other at the first end portion of the crank 262 and the third pivotable joint portion 210c of the first arm link 210. The first crank 262 and the first retainer link 219 are pivotably connected with each other at the second end portion of the first crank 262 and the first end portion of the first retainer link 219.

The first link retaining mechanism 230 further comprises a first output link and a first handling member, not shown, which are respectively similar to the first output link 216 and the first handling member 214 of the first preferred embodiment of the robot arm mechanism according to the present invention.

The second link retaining mechanism 231 further comprises a second retainer link 228 and a second crank 254 respectively having first and second end portions. The second retainer link 228 is substantially equal in length to the length from the third pivotable joint portion 211c to the second end portion of the second arm link 211.

The second crank 254 and the second arm link 211 are pivotably connected with each other at the first end portion of the second crank 254 and the third pivotable joint portion 211c of the second arm link 211. The second crank 254 and the second retainer link 228 are pivotably connected with each other at the second end portion of the second crank 254 and the first end portion of the second retainer link 228.

The second link retaining mechanism 231 further comprises a second output link and a second handling member, not shown, which are respectively similar to the second output link 217 and the second handling member 215 of the first preferred embodiment of the robot arm mechanism according to the present invention.

The robot arm mechanism 200 further comprises a link operating mechanism 232 including a first and second link operating mechanisms 450 and 460.

The first link operating mechanism 261 comprises the first crank 262, a first coupling link 263, and a first connecting link 265 respectively having first and second end portions. The second link operating mechanism 460 comprises the second crank 254, a second coupling link 235, and a second connecting link 237 respectively having first and second end portions.

The first and second coupling links 263 and 235, and the first and second connecting links 265 and 237 are equal in length to each other. The sum of the lengths of the first coupling link 263 and the first connecting link 265 is greater than the sum of length between the third pivotable joint portions 210c and 211c of the first and second arm links 210 and 211. The first and second cranks 262 and 254 are substantially equal in length to each other.

The first crank 262 and the first coupling link 263 are integrally connected with each other at the first end portion of the first crank 262 and the first end portion of the first coupling link 263 at an acute angle from each other. The first connecting link 265 and the second arm link 211 are pivotably connected with each other at the first end portion of the first connecting link 265 and the third pivotable joint portion 211c of the second arm link 211.

The first connecting link 265 and the first coupling link 263 are pivotably connected by a pivotable joint 264 with each other at the second end portion of the first connecting link 265 and the second end portion of the first coupling link 263.

The second crank 254 and the second coupling link 235 are integrally connected with each other at the first end portion of the second crank 254 and the first end portion of the second coupling link 233 at an acute angle from each other.

The second connecting link 237 and the first arm link 210 are pivotably connected with each other at the first end portion of the second connecting link 237 and the third pivotable joint portion 211c of the first arm link 210. The second connecting link 237 and the second coupling link 235 are pivotably connected by a pivotable joint 236 with each other at the second end portion of the second connecting link 237 and the second end portion of the second coupling link 235.

The first and second coupling links 263 and 235, and the first and second connecting links 237 and 265 form a parallelogram linkage to keep the pivotable joints 264 and 236 at opposite side from each other with respect to the rotation axis 298.

The operation of the robot arm mechanism in the third preferred embodiment is similar to the operation of the robot arm mechanism 200 in the first preferred embodiment according to the present invention. The first and second link operating mechanisms 450 and 460 keep the first and second cranks 262 and 254 in parallel relationship with each other at all the time, enabling the first and second handling members, not shown, in parallel relationship with each other at all the time. The first and second cranks 262 and 234 serve as the link retaining mechanism and the link operating mechanism, thereby reducing parts of the robot arms 220 such as the first and second joint links 223 and 224.

Figure 12:
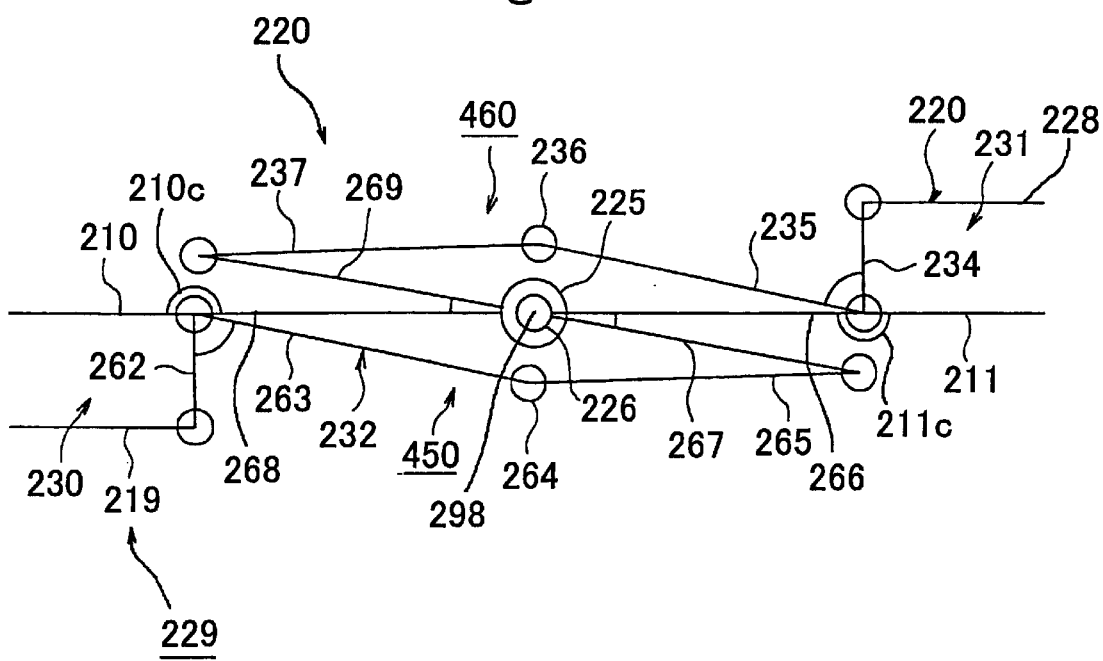
FIG. 12 is an enlarged fragmentary skeleton view of the fourth preferred embodiment of the robot arm mechanism according to the present invention.

Referring to FIG. 12 of the drawing, there is shown a fourth preferred embodiment of the robot arm mechanism according to the present invention. The robot arm 220 is shown in FIG. 12 as comprising a first and second arm links 210 and 211 respectively having first and second end portions. The first and second arm links 210 and 211 are respectively similar to the first and second arm links 210 and 211 of the third preferred embodiment of the robot arm mechanism according to the present invention.

The robot arm 220 further comprises a link retaining mechanism 229 including a first link retaining mechanism 230 and a second link retaining mechanism 231 which are respectively similar to the link retaining mechanism 229, the first link retaining mechanism 230 and the second link retaining mechanism 231 of the third preferred embodiment of the robot arm mechanism according to the present invention.

The first link retaining mechanism 230 further comprises a first retainer link 219 and a first crank 262 respectively having first and second end portions and similar to the first retainer link 219 and the first crank 262 of the third preferred embodiment of the robot arm mechanism according to the present invention.

The second link retaining mechanism 231 further comprises a second retainer link 228 and a second crank 254 respectively having first and second end portions and similar to the second retainer link 228 and the second crank 254 of the third preferred embodiment of the robot arm mechanism according to the present invention.

The robot arm mechanism 200 further comprises a link operating mechanism 232 including a first and second link operating mechanisms 450 and 460.

The first link operating mechanism 261 comprises the first crank 262, a first coupling link 263, a first connecting link 265, and a first supporting link 267 respectively having first and second end portions. The second link operating mechanism 460 comprises the second crank 254, a second coupling link 235, a second connecting link 237, and a second supporting link 269 respectively having first and second end portions.

The first supporting link 267 is substantially equal in length to the first coupling link 263. The second supporting link 269 is substantially equal in length to the second coupling link 235.

The first supporting link 267 and the second arm link 211 are integrally connected with each other at the first end portion of the first supporting link 267 and the first end portion of the second arm link 211 at an acute angle from each other. The first supporting link 267 and the first connecting link 265 are pivotably connected each other at the second end portion of the first supporting link 267 and the first end portion of the first connecting link 265. The second supporting link 269 and the first arm link 210 are integrally connected with each other at the first end portion of the second supporting link 269 and the first end portion of the first arm link 210 at an acute angle from each other. The second supporting link 269 and the second connecting link 237 are pivotably connected each other at the second end portion of the second supporting link 269 and the first end portion of the second connecting link 237.

The first coupling link 263, the first connecting link 265, the first supporting link 267, and a link portion between the rotation axis 298 and the third pivotable joint portion 210c of the first arm link 210 form a parallelogram linkage. The second coupling link 235, the second connecting link 237, the second supporting link 269, and a link portion between the rotation axis 298 and the third pivotable joint portion 211c of the second arm link 211 form a parallelogram linkage.

The operation of the robot arm mechanism in the fourth preferred embodiment is similar to the operation of the robot arm mechanism 200 in the third preferred embodiment according to the present invention. The first and second link operating mechanisms 450 and 460 keep the first and second cranks 262 and 254 in parallel relationship with each other at all the time, enabling the first and second handling members, not shown, in parallel relationship with each other at all the time. This robot arm 220 can reduce a number of overlapped joint portions of the first and second link operating mechanism 450 and 460.

Figure 13:
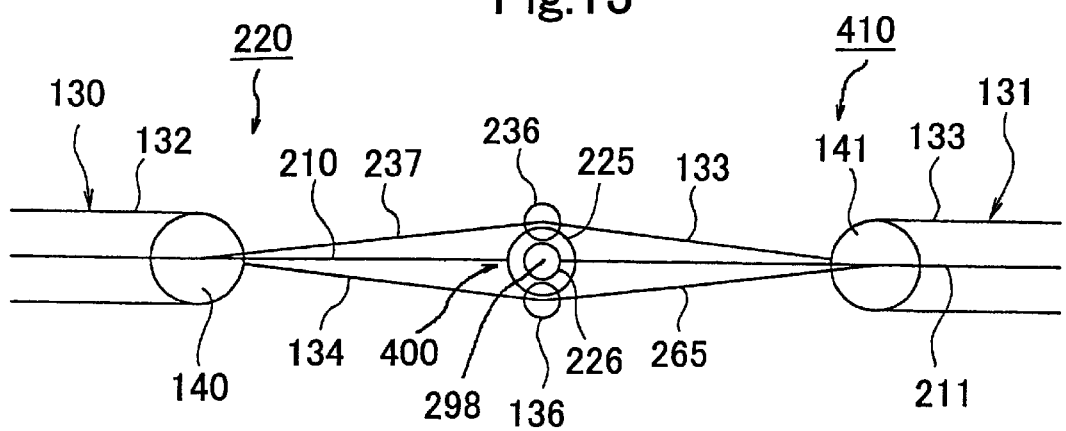
FIG. 13 is an enlarged fragmentary skeleton view of the fifth preferred embodiment of the robot arm mechanism according to the present invention.
Figure 14:
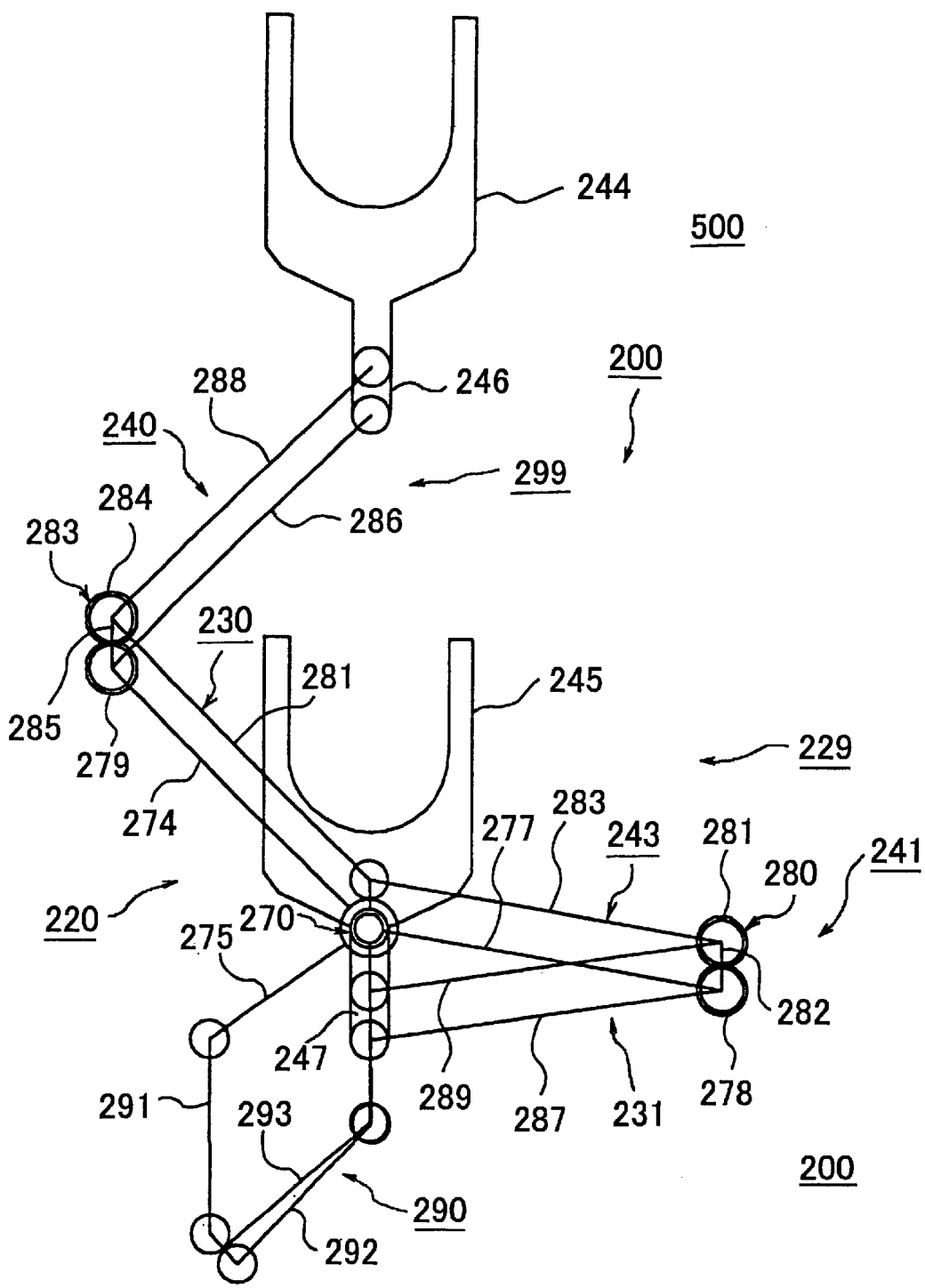
FIG. 14 is a skeleton view of one condition of the sixth preferred embodiment of the robot arm mechanism according to the present invention.
Figure 15:
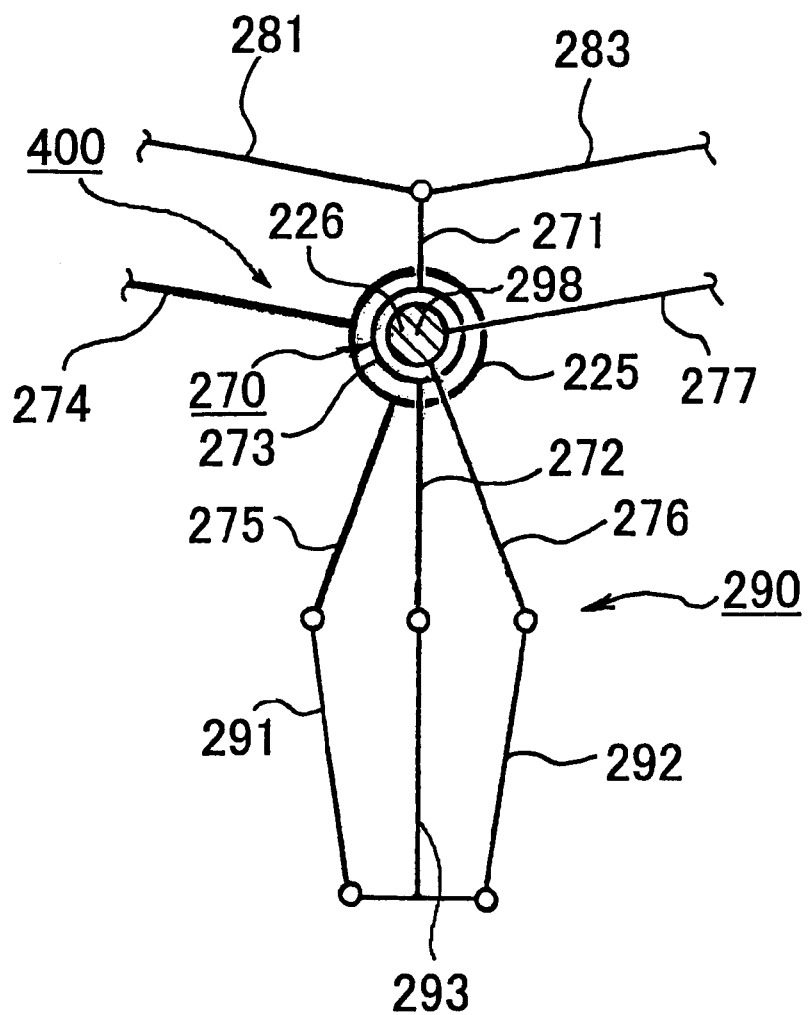
FIG. 15 is an enlarged fragmentary skeleton view of another condition of the sixth preferred embodiment of the robot arm mechanism according to the present invention.

Referring to FIG. 13 of the drawing, there is shown a fifth preferred embodiment of the robot arm mechanism according to the present invention. The robot arm mechanism 200 is shown in FIG. 13 as comprising a robot arm 220 which includes a first and a second arm links 210 and 211 respectively having first and second end portions and respectively similar to the first arm link 210 and the second arm link 211 of the first preferred embodiment of the robot arm mechanism according to the present invention.

The first arm link 210 is integrally connected at the first end portion to a first driving shaft 225 to be rotated clockwise or counterclockwise around a rotation axis 298. The second arm link 211 is integrally connected at the first end portion to a second driving shaft 226 to be rotated clockwise or counterclockwise around the rotation axis 298.

The first driving shaft 225 is formed with a hollow along the rotation axis 298 to rotatably receive therein the second driving shaft 226 in coaxial relationship with the first driving shaft 225.

The robot arm mechanism 200 further comprises a synchronous mechanism 410 including a first and second belt-pulleys 140 and 141 in stead of the first and second cranks 262 and 254 of the first and second link operating mechanisms 5450 and 460 of the third embodiment according to the present invention. The synchronous mechanism also functions as a link retaining mechanism. The first and second belt-pulleys 140 and 141 transfer their motion to output pulleys, not shown, provided at the second end portions of the first and second arm links 210 and 211 by belts 132 and 133. This keeps the attitudes of the handling members. The belts 132 and 133 may be replaced by wires. The belt-pulley mechanism may be replaced by synchronous gears. This simple construction is available to scalar robots.

Referring to FIGS. 14 to 17 of the drawings, there is shown a sixth preferred embodiment of the robot arm mechanism according to the present invention. The robot arm mechanism 200 is shown in FIGS. 14 to 17 as comprising a first and second handling members 244 and 245 for respectively supporting and handling an object and respectively having first and second end portions. The first and second handling members are integrally connected to a first and second handling support links 246 and 247 respectively having first and second end portions.

The robot arm mechanism 200 further comprises a first and second arm links 274 and 277 respectively having first and second end portions and similar to the first and second arm links 210 and 211 of the first preferred embodiment of the robot arm mechanism according to the present invention. The first and second arm link 274 and 277 are rotatable around a rotation axis 298.

The robot arm mechanism 200 further comprises a robot arm driving mechanism 400 including a first and second driving shafts 225 and 226 rotatable around the rotation axis 298 and respectively similar to the first and second driving shafts 225 and 226 of the first preferred embodiment of the robot arm mechanism according to the present invention.

The robot arm mechanism 200 further comprises a link retaining mechanism 229 including a first and second link retaining mechanisms 230 and 231. The first link retaining mechanism 230 comprises a first retainer link 281, a crank member 271, and a first output link 285 respectively having first and second end portions. The first retainer link 281 and the first arm link 274 are substantially equal in length to each other. The first output link 285 and the crank member 271 are substantially equal in length to each other.

The first arm link 274 is integrally connected at the first end portion of the first arm link 274 to a first driving shaft 225. The first arm link 274 and the first output link 285 are pivotably connected with each other at the second end portion of the first arm link 274 and the first end portion of the first output link 285. The first retainer link 281 and the crank member 271 are pivotaby connected with each other at the first end portion of the first retainer link 281 and a second end portion of the crank member 271. The first retainer link 281 and the first output link 285 are pivotably connected with each other at the second end portion of the first retainer link 281 and the second end portion of the first output link 285.

The first arm link 274, the first retainer link 281, the crank member 271 and the first output link 285 form a parallelogram linkage.

The second link retaining mechanism 231 comprises a second retainer link 283 and a second output link 282 respectively having first and second end portions.

The second retainer link 283 and the second arm link 277 are substantially equal in length to each other. The second output link 282 and the crank member 271 are substantially equal in length to each other.

The second arm link 277 is integrally connected at the first end portion of the second arm link 277 to a second driving shaft 226. The second arm link 277 and the second output link 282 are pivotably connected with each other at the second end portion of the second arm link 277 and the first end portion of the second output link 282. The second retainer link 283 and the crank member 271 are pivotaby connected with each other at the first end portion of the second retainer link 283 and a second end portion of the crank member 271. The second retainer link 283 and the second output link 282 are pivotably connected with each other at the second end portion of the second retainer link 283 and the second end portion of the second output link 282.

The second link retaining mechanism 231 further comprises the crank member 271 which also serves as a component of the first retainer link 230.

The second arm link 277, the second retainer link 283, the crank member 271 and the second output link 282 form a parallelogram linkage.

The robot arm mechanism 200 further comprises an additional arm linkage 299 including a first additional linkage 240 and a second additional linkage 243. The first additional linkage 240 comprises a third and fourth arm links 286 and 288 respectively having first and second end portions. The second additional linkage 243 comprises a fifth and sixth arm links 287 and 289 respectively having first and second end portions.

The third arm link 286 and the first handling support link 246 are pivotably connected with each other at the first end portion of the third arm link 286 and the first end portion of the first handling support link 246. The third arm link 286 and the first arm link 2 are pivotably connected with each other at the second end portion of the third arm link 287 and the second end portion of the first arm link 210. The third arm link 286 and the first output link 285 are pivotably connected with each other at the second end portion of the third arm link 287 and the first end portion of the first output link 285.

The fourth arm link 288 and the first handling support link 246 are pivotably connected with each other at the first end portion of the fourth arm link 288 and the second end portion of the first handling support link 246. The fourth arm link 288 and the first retainer link 281 are pivotably connected with each other at the second end portion of the fourth arm link 288 and the second end portion of the first retainer link 281. The fourth arm link 288 and the first output link 285 are pivotably connected with each other at the second end portion of the fourth arm link 288 and the second end portion of the first output link 285.

The third arm link 286, the fourth arm link 288, the first handling support link 246 and the first output link 285 form a parallelogram linkage. This results in the fact that the third arm link 286 and the fourth arm link 288 always pivotably retain the first handling support link 246 and the first output link 285 in parallel relationship with each other.

The fifth arm link 287 and the second handling support link 247 are pivotably connected with each other at the first end portion of the fifth arm link 287 and the first end portion of the first handling support link 246. The fifth arm link 287 and the second arm link 277 are pivotably connected with each other at the second end portion of the fifth arm link 287 and the second end portion of the second arm link 277. The fifth arm link 287 and the second output link 282 are pivotably connected with each other at the second end portion of the fifth arm link 287 and the first end portion of the second output link 282.

The sixth arm link 289 and the second handling support link 247 are pivotably connected with each other at the first end portion of the sixth arm link 289 and the second end portion of the second handling support link 247. The sixth arm link 289 and the second output link 282 are pivotably connected with each other at the second end portion of the sixth arm link 289 and the second end portion of the second output link 282.

The fifth arm link 287, the sixth arm link 289, the second handling support link 247 and the second output link 282 form a parallelogram linkage. This results in the fact that the fifth arm link 287 and the sixth arm link 289 always pivotably retain the second handling 247 and the second output link 282 in parallel relationship with each other.

The robot arm 220 further comprises a synchronous mechanism 241 including a first synchronous mechanism 283 for the first additional linkage 240 and a second synchronous mechanism 280 for the second additional linkage 243.

The first synchronous mechanism 283 comprises a first synchronous gear 279 fixed on the second end portion of the first arm link 274 and a second synchronous gear 284 rotatably provided on the second end portion of the first output link 285. The first and second synchronous gears 279 and 284 are meshed with each other to rotate the third arm link 286 and the fourth arm link 288 with respect the first arm link 274 and the first retainer link 281.

The second synchronous mechanism 280 comprises a third synchronous gear 278 fixed on the first end portion of the second arm link 277 and a fourth synchronous gear 281 rotatably provided on the second end portion of the second output link 282. The third and fourth synchronous gears 278 and 281 are meshed with each other to rotate the fifth arm link 287 and the sixth arm link 289 with respect the second arm link 277 and second retainer link 283.

The robot arm 220 further comprises a link operating mechanism 290 including a supporting member 273 and a lever mechanism 270. The lever mechanism 270 comprises a link member 272 which has first and second end portions. The lever mechanism 270 further comprises the crank member 271 which serves as a component of the link retaining mechanism 229.

The crank member 271 is integrally connected at the first end portion of the crank member 271 to the supporting member 273. The link member 272 is longer than the crank member 271 and integrally connected at the first end portion to the supporting member 273 on the opposite side of the crank member 271.

The link operating mechanism 290 further comprises a first operating link 275, a second operating link 276, a third operating link 291, and a fourth operating link 292 respectively having first and second end portions.

The link operating mechanism 290 further comprises a fifth operating link 293 formed in a T-shape and having the first and second end potions and third end portion between the first and second end portions.

The first operating link 275 and the second operating link 276 are equal in length to each other. The first operating link 275 and the second operating link 276 are a little longer than the third operating link 291.

The third operating link 291 and the fourth operating link 292 are equal in length to each other.

The first operating link 275 is integrally connected at the first end portion of the first operating link 275 to a first driving shaft 225 and rotates around the axis 298. The second operating link 276 is integrally connected at the first end portion of the second operating link 276 to a second driving shaft 226 and rotates around the axis 298.

The first operating link 275 and the third operating link 291 are pivotably connected with each other at the second end portion of the first operating link 275 and the first end portion of the third operating link 291. The second operating link 276 and the fourth operating link 292 are pivotably connected with each other at the second end portion of the second operating link 276 and the first end portion of the fourth operating link 292. The third operating link 291 and the fifth operating link 293 are pivotably connected with each other at the second end portion of the third operating link 291 and the first end portion of the fifth operating link 293. The fourth operating link 292 and the fifth operating link 293 are pivotably connected with each other at the second end portion of the fourth operating link 292 and the second end portion of the fifth operating link 293. The link member 272 and the fifth operating link 293 are pivotably connected with each other at the second end portion of the link member 272 and the third end portion of the fifth operating link 293.

Figure 16:
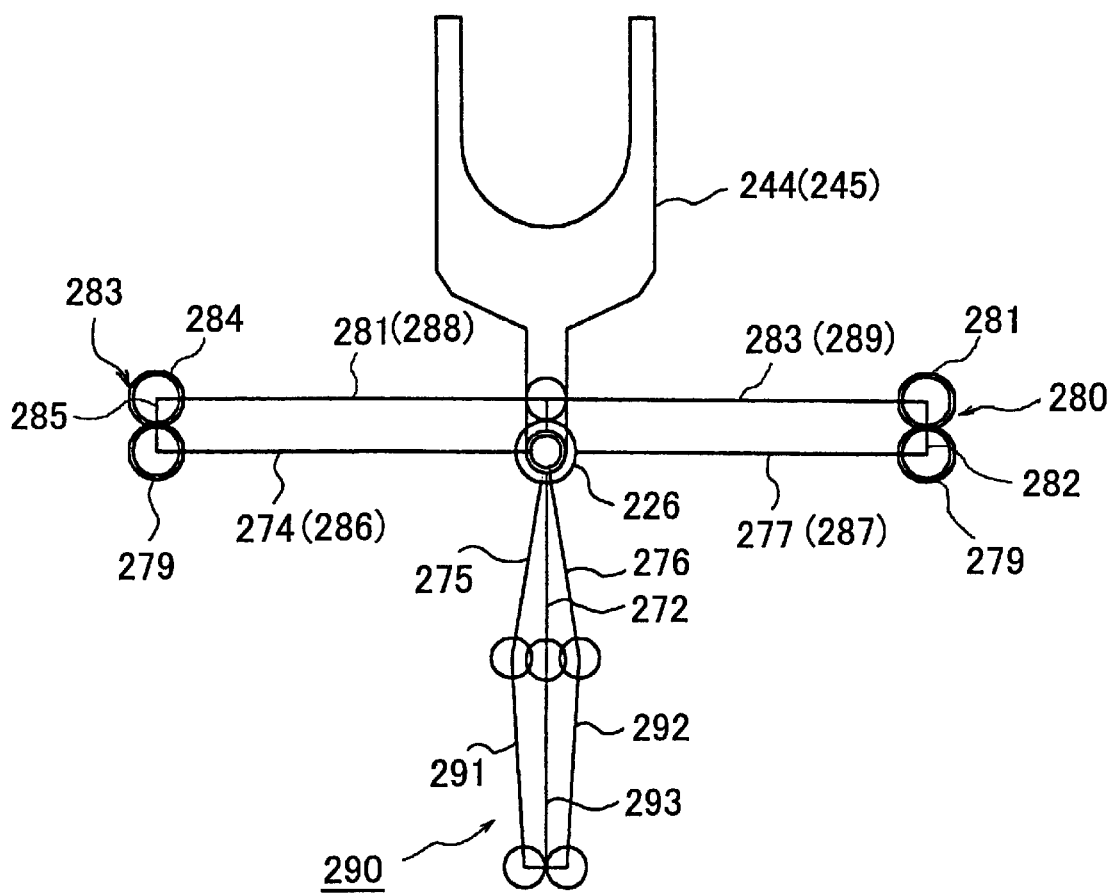
FIG. 16 is a skeleton view of another condition of the sixth preferred embodiment of the robot arm mechanism according to the present invention.
Figure 17:
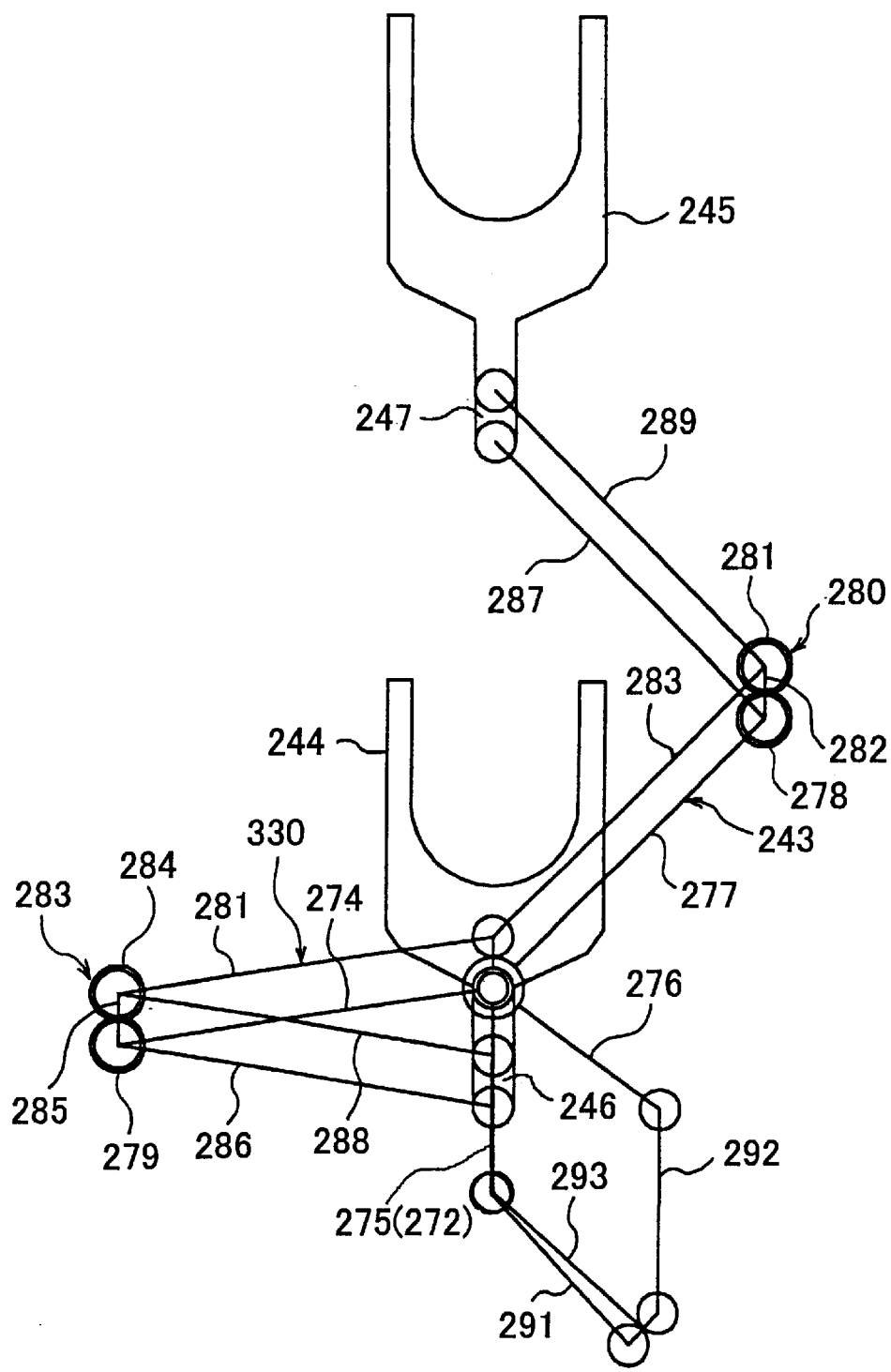
FIG. 17 is a skeleton view of further condition of the sixth preferred embodiment of the robot arm mechanism according to the present invention.

When the first and second arm links 274 and 277 are moved to a home position, the first and second arm links 274 and 277 are in linear states shown in FIG. 16, and the first and second handling members 244 and 245 are positioned at the same place in over-under.

In this embodiment, the first and second cranks 262 and 234 serve as both of the link retaining mechanism and the link operating mechanism, thereby reducing a number of the parts of the robot arm 220 such as the first and second joint links 223 and 224.

Figure 18:
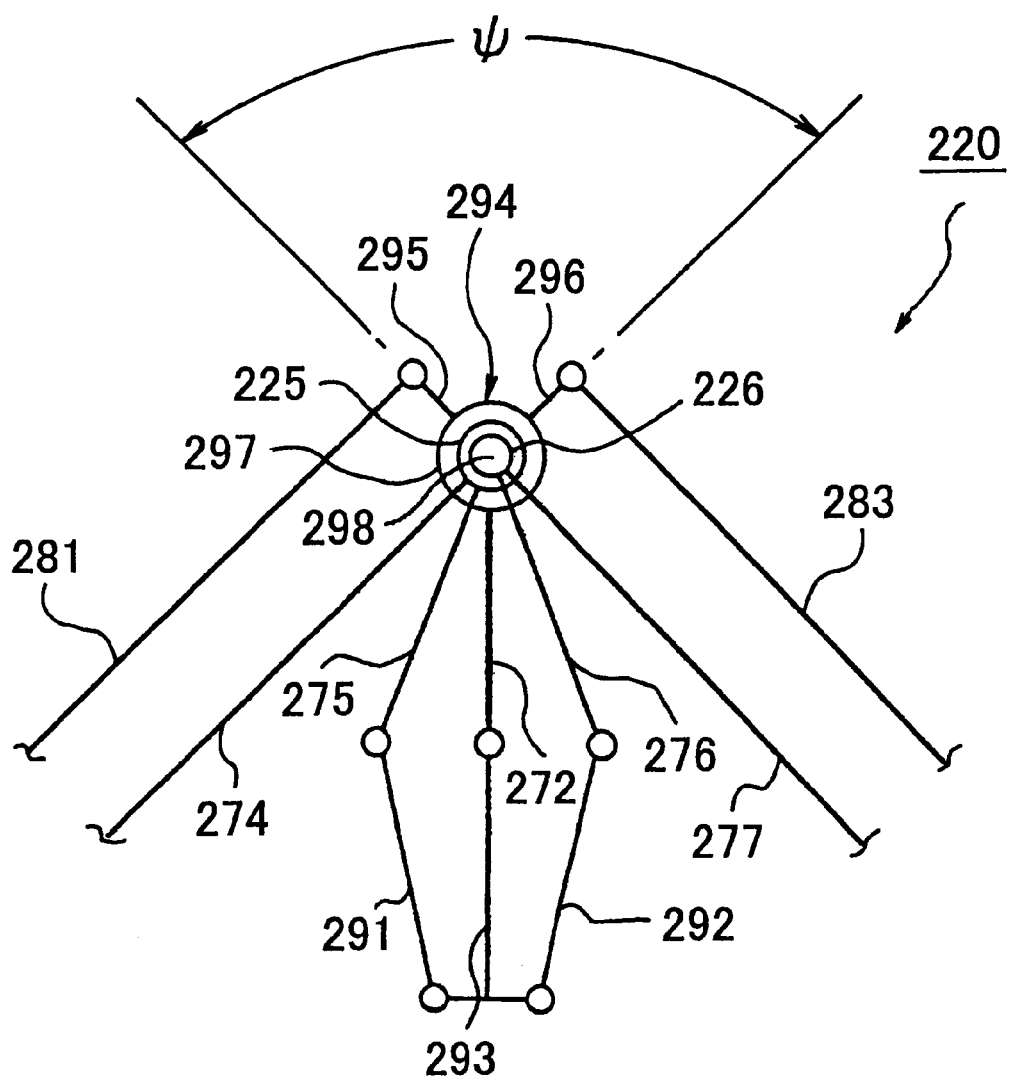
FIG. 18 is an enlarged fragmentary skeleton of the seventh preferred embodiment of the robot arm mechanism according to the present invention.

Referring to FIG. 18 of the drawing, there is shown a seventh preferred embodiment of the robot arm mechanism according to the present invention. The robot arm mechanism 200 is shown in FIG. 18 as comprising a robot arm 220 including a first and second arm links 274 and 277 respectively having first and second end portions and respectively similar to the first and second arm links 274 and 277 of the robot arm mechanism 200 in the sixth preferred embodiment.

The robot arm 220 further comprises a first and second retainer links 281 and 283 respectively having first and second end portions and respectively similar to the first and second retainer links 281 and 283 of the robot arm mechanism 200 in the sixth preferred embodiment.

The construction of the robot arm mechanism in the present preferred embodiment is similar to the construction of the robot arm mechanism 200 in the sixth preferred embodiment except for a lever mechanism 294.

The lever mechanism 294 comprises a first crank member 295 and a second crank member 296 respectively having first and second end portions. The lever mechanism 294 comprises a supporting member 297 in coaxial relationship with a first and second driving shafts 225 and 226. The first crank member 295 is integrally connected at the first end portion to the supporting member 297. The first crank member 295 and the first retainer 281 are pivotably connected with each other at the second end portion of the first crank member 295 and the first end portion of the first retainer link 281.

The second crank member 295 is integrally connected at the first end portion to the supporting member 297. The second crank member 296 and the second retainer 283 are pivotably connected with each other at the second end portion of the second crank member 296 and the first end portion of the second retainer link 283.

The first crank member 295 and the second crank member 296 are arranged at an acute angle of $\Psi$ with each other.

In this embodiment, designs of the robot arms such as the first and second arm links 274 and 277 and the handling members 244 and 245 can be designed from arbitrary selections by varying the angle of $\Psi$ and the lengths of the first and second crank member 295 and 296.

Figure 19:
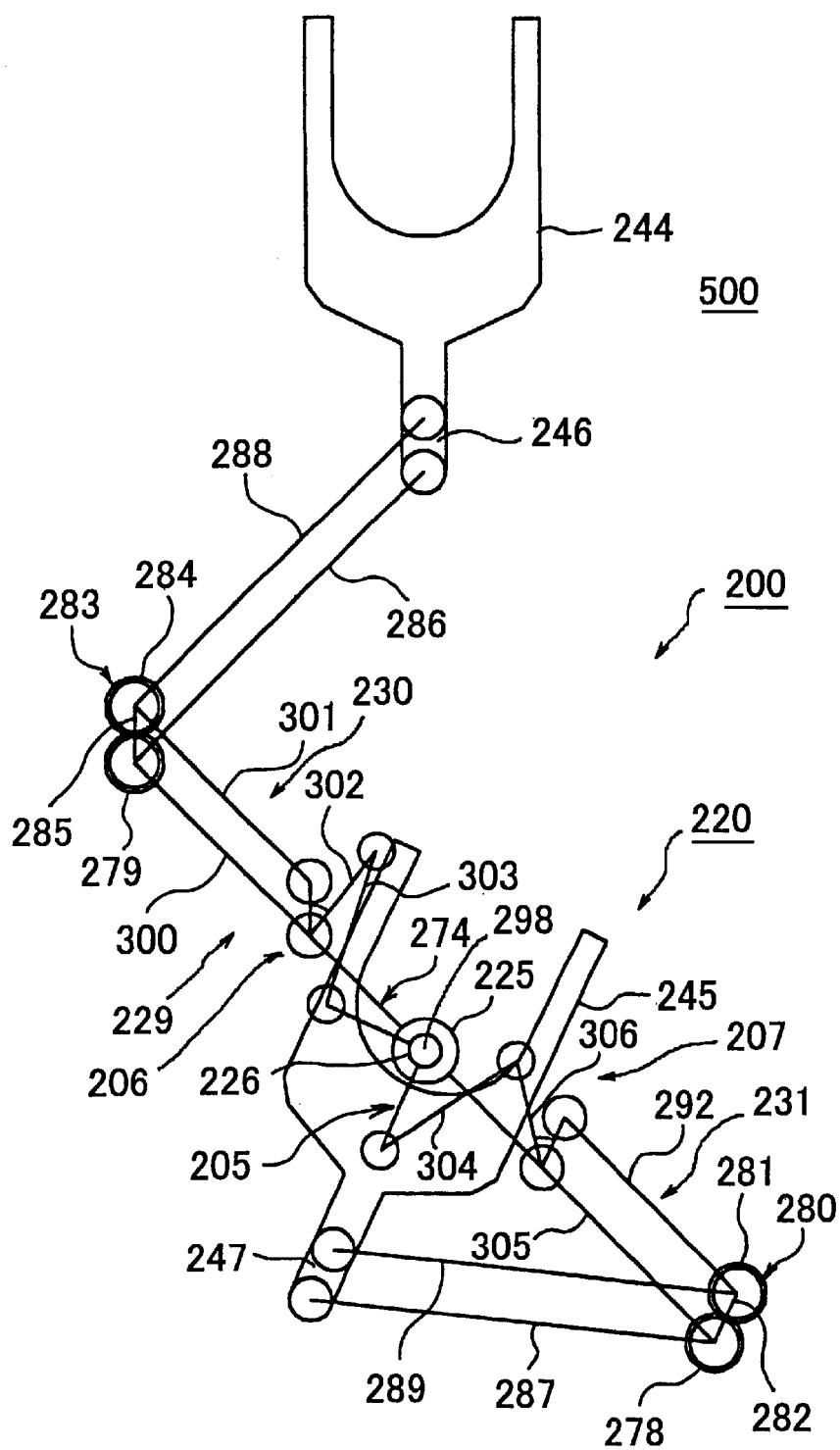
FIG. 19 is a skeleton view of one condition of the eighth preferred embodiment of the robot arm mechanism according to the present invention.
Figure 20:
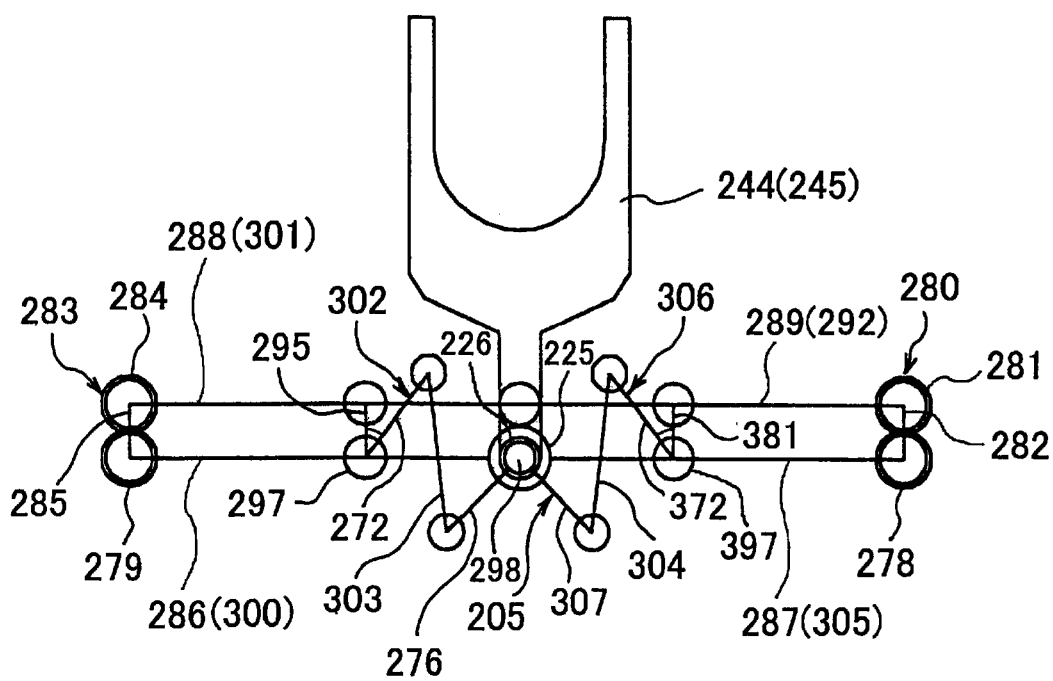
FIG. 20 is a skeleton view of another condition of the eighth preferred embodiment of the robot arm mechanism according to the present invention.
Figure 21:
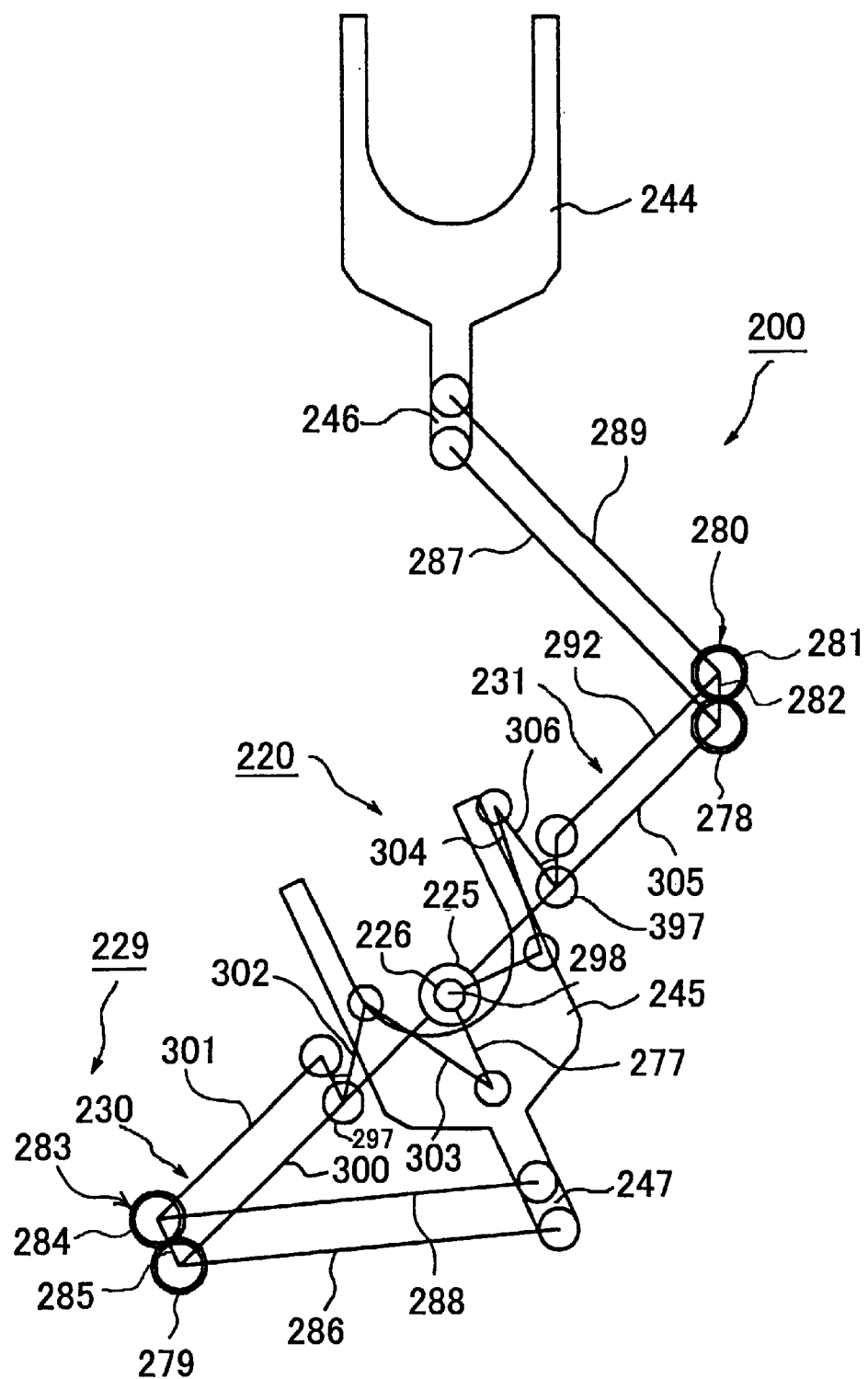
FIG. 21 is a skeleton view of further condition of the eighth preferred embodiment of the robot arm mechanism according to the present invention.

Referring to FIGS. 19 to 21 of the drawings, there is shown a eighth preferred embodiment of the robot arm mechanism according to the present invention. The robot arm mechanism 200 is shown in FIG. 18 as comprising a robot arm 220 including a first and second arm links 300 and 305 respectively having first and second end portions and rotatable around a rotation axis 298. The first arm link 300 has a third pivotable joint portion 297 between the first and second end portions of the first arm link 300. The second arm link 305 has a third pivotable joint portion 397 between the first and second end portions of the second arm link 305.

The robot arm mechanism 200 further comprises a first and second driving shafts 225 and 226 rotable around the rotation axis 298.

The robot arm 220 further comprises a first and second retainer links 301 and 292 respectively having first and second end portions.

The first arm link 300 is integrally connected at the first end portion of the first arm link 300 to the first driving shaft 225 and rotatable around the rotation axis 298. The second arm link 305 is integrally connected at the first end portion to the first driving shaft 225 and rotatable around the rotation axis 298. The first and second arm link 300 and 305 is positioned at an angle of substantially 180 degrees from each other.

The robot arm 220 further comprises a link operating mechanism 205 including a first and second link operating mechanisms 206 and 207.

The first link operating mechanism 206 is pivotably connected with the first arm link 300. The second link operating mechanism 207 is pivotably connected with the second arm link 305.

The first link operating mechanism 206 comprises a first lever member 302, a first connecting link 303, and a first long link 276 respectively having first and second end portions. The first lever member 302 comprises a first crank 295 and a first coupling link 272 respectively having first and second end portions. The first long link 276 is rotatable around the rotation axis 298.

The second link operating mechanism 207 comprises a second lever member 306, a second connecting link 304, and a second long link 307 respectivelly having first and second end portions. The second lever member 306 comprises a second crank 381 and a second coupling link 372 respectively having first and second end portions. The second long link 30 is rotatable around the rotation axis 298.

The first crank 295 and the first coupling link 272 are integrally connected with each other at the first end portion of the first crank 295 and the first end portion of the first coupling link 272 at an acute angle from each other. The first crank 295 and the first arm link 300 are pivotably connected with each other at the first end portion of the first crank 295 and the first pivotable joint portion 297 of the first arm link 300. The first crank 295 and the first retainer link 301 are pivotably connected with each other at the second end portion of the first crank 295 and the first end portion of the first retainer crank 301. The first coupling link 272 and the first connecting link 303 are pivotably connected with each other at the second end portion of the first coupling link 302 and the first end portion of the first connecting link 303. The first connecting link 303 and the first long link 276 are pivotably connected with each other at the second end portion of the first connecting link 303 and the second end portion of the first long link 276. The first and second long links 276 and 307 are integrally connected with each other at the first end portions of the first and second long links 276 and 307 at an acute angle from each other and rotatable around the rotation axis 298.

The second crank 381 and the second coupling link 372 are integrally connected with each other at the first end portion of the second crank 381 and the first end portion of the second coupling link 372 at an acute angle from each other. The second crank 381 and the second arm link 305 are pivotably connected with each other at the first end portion of the second crank 381 and the first pivotable joint portion 397 of the second arm link 305. The second crank 381 and the second retainer link 292 are pivotably connected with each other at the second end portion of the second crank 381 and the first end portion of the second retainer link 292. The second coupling link 372 and the second connecting link 304 are pivotably connected with each other at the second end portion of the second coupling link 372 and the first end portion of the second connecting link 304. The second connecting link 304 and the second long link 307 are pivotably connected with each other at the second end portion of the second connecting link 304 and the second end portion of the second long link 307.

In this embodiment, only two electric motors can contract and extend the first and second arm links 300 and 305 and rotate them together under the state that the first and second arm links 300 and 305 are united. It is not necessary to rotate a robot-arm supporting disk to rotate the first and second arm links 3000 and 300. This results in the fact that the robot arm mechanism 200 according to the this embodiment of the present invention enables its construction simpler.

According to the present invention, the rotation axes of the first and second driving shafts 225 and 226 may be not in coaxial relationship with each other.

According to the present invention, the rotation axes of the first and second driving shaft 225 and 226 and the rotation axis of the first and second arms may be not in coaxial relationship with each other.

According to the present invention, a ratio of the crank and the coupling link may be made an arbitrary selection.

According to the present invention, a length ratio of the crank to the coupling link may be decided by an arbitrary selection.

According to the present invention, the first joint portions 210a, 21a, 297, 397 may be designed at any desirable position of the first and second arm links 210,211, 300, 305.

According to the present invention, the connecting link may be pivotably connected at the second end portion of the connecting link with the coupling link through another pivotably connected link.

According to the present invention, the retainer link may be pivotably connected with the second end portion of the coupling link instead of the crank.

What is claimed is:
1. A robot arm mechanism comprising:
a plurality of handling members for supporting and handling an object, the plurality of handling members comprising a first handling member and a second handling member,
a robot arm connected to the handling members, the robot arm comprising a first arm link having first and second end portions and a first pivotable joint portion between the first and second end portions of the first arm link, a second arm link having first and second end portions and a first pivotable joint portion between the first and second end portions of the second arm link, the first and second arm links respectively rotatable around a rotation axis, a link retaining mechanism for retaining attitudes of the first and second handling members, a link operating mechanism for operating the link retaining mechanism according to a rotation angle between the first and second arm links, the link operating mechanism comprising a lever member pivotably connected with the link retaining mechanism, the lever member comprising a crank and a coupling link respectively having first and second end portions, the crank pivotably connected at the first end of the crank with one of the first and second arm links, the crank integrally connected to the coupling link, the link operating mechanism further comprising a connecting link having first and second end portions, the connecting link pivotably connected at the first end portion of the connecting link to the other of the first and second arm links, the connecting link and the coupling link pivotably connected with each other at the second end portion of the connecting link and the second end portion of the coupling link, a robot arm driving mechanism for driving the robot arm, the robot arm driving mechanism comprising a first driving shaft and a second driving shaft.

2. A robot arm mechanism as set forth in claim 1 in which the link retaining mechanism forms a parallelogram linkage.

3. A robot arm mechanism as set forth in claim 2 in which the link retaining mechanism comprises a retainer link in parallel relationship with one of the first and second arms, the retainer link pivotably connected with the second end portion of the crank.

4. A robot arm mechanism as set forth in claim 2 in which the link retaining mechanism comprises a retainer link in parallel relationship with one of the first and second arms, the retainer link pivotably connected with the second end portion of the coupling link.

5. A robot arm mechanism as set forth in claim 1 in which the first and second driving shafts are able to be drive the first and second arms be to rotated at the same speed and in the same rotation direction whereby the first and second arms are rotated under a state such that the first and second arms are united together.

6. A robot arm mechanism as set forth in claim 1 in which the second and third rotation axis are in coaxial relationship with the rotation axis and the first and second driving shafts are rotatable independently of each other.

7. A robot arm mechanism comprising:
 a plurality of handling members for supporting and handling an object, the plurality of handling members comprising a first handling member and a second handling member,
 a robot arm connected to the handling members, the robot arm comprising a first arm link having first and second end portions and a first pivotable joint portion between the first and second end portions of the first arm link, a second arm link having first and second end portions and a first pivotable joint portion between the first and second end portions of the second arm link, the first and second arm links respectively rotatable around a rotation axis, a link retaining mechanism for retaining attitudes of the first and second handling members, the retaining mechanism comprising a first link retaining mechanism forming a parallelogram linkage and pivotably retraining the first arm link, a second link retaining mechanism forming another parallelogram linkage and pivotably retaining the second arm link, the first link retaining mechanism comprising a first retainer link having first and second end portions, a first joint link having first and second end portions and shorter than the first arm link and rotatable around the rotation axis, and a first output link having first and second end portions and substantially equal in length to the first joint link, the first output link connected to the first handling member, the first retainer link and the first joint link pivotably connected with each other at the first end side portion of the first retainer link and the second end portion of the first joint link, the first output link and the first arm link pivotably connected with each other at the first end portion of the first output link and the second end portion of the first arm link, the first output link and the first retainer link pivotably connected with each other at the second end portion of the first output link and the second end portion of the first retainer link, the second link retaining mechanism comprising a second retainer link having first and second end portions, a second joint link having first and second end portions and shorter than the second arm link and rotatable the rotation axis, and a second output link having first and second end portions and substantially equal in length to the second joint link, the second output link connected to the second handling member, the second retainer link and the second joint link pivotably connected with each other at the first end portion of the second retainer link and the second end portion of the second joint link, the second output link and the second arm link pivotably connected with each other at the first end portion of the second output link and the second end portion of the second arm link, the second output link and the second retainer link pivotably connected with each other at the second end portion of the second output link and the second end portion of the second retainer link, and a link operating mechanism operating one of the first and second arm links by a motion of the other of the first and second arm links, the link operating mechanism comprising a lever member which includes a crank having first and second end portions, and a coupling link having first and second end portions, and a connecting link having first and second end portions, the crank and the coupling link integrally connected with each other at the first end portion of the crank and the first end portion of the coupling link, the crank pivotably connected with each other at the first end portion of the crank to the second arm link, the crank pivotably connected at the second end portion of the crank to the second retainer link, the crank equal in length to and in parallel relationship with the second joint link, the connecting link pivotably connected at the first end portion of the connecting link to the first pivotable portion of the first arm link, the connecting link and the coupling link pivotably connected with each other at the second end portion of the connecting link and the second end portion of the coupling link;

a robot arm driving mechanism for driving the robot arm, the robot arm driving mechanism comprising a first driving shaft and a second driving shaft.

8. A robot arm mechanism as set forth in claim 7 in which the second retainer link has a joint portion between the first and second end portions of the second retainer link, the crank and the second retainer link pivotably connected each other at the second end portion of the crank and the joint portion of the second retainer link, the first arm link integrally connected at the first end portion of the first arm link to the first driving shaft, the second arm link integrally connected at the first end portion of the second arm link to the second driving shaft.

9. A robot arm mechanism as set forth in claim 8 in which the sum of the lengths of the coupling link and the connecting link is greater than the sum of lengths between the rotation axis and the first pivotable joint portions of the first and second arm links.

10. A robot arm mechanism as set forth in claim 7 in which the link operating mechanism further comprises a first and second link operating mechanisms positioned at the opposite sides to each other with respect to the rotation axis, the crank comprising a first crank of the first link operating mechanism and a second crank of the second link operating mechanism respectively having first and second end portions, the coupling link comprising a first coupling link of the first link operating mechanism and a second coupling link of the second link operating mechanism respectively having first and second end portions, the connecting link comprising a first connecting link of the first link operating mechanism and a second connecting link of the second link operating mechanism respectively having first and second end portions, the first and second coupling links substantially equal in length to each other, the first and second connecting links substantially equal in length to each other, the first crank serving as the first pivotable joint link, the first crank and the first arm link pivotably connected with each other at the first end portion of first crank and the first pivotable joint portion of the first arm link, the first crank and the first coupling link integrally connected with each other at the first end portion of first crank and the first end portion of the first coupling link at an acute angle from each other, the first crank and the first retainer link pivotably connected with each other at the second end portion of the first crank and the first end portion of the first retainer link, the first connecting link and the second arm link pivotably connected with each other at the first end portion of the first connecting link and the first pivotable joint portion of the second arm link, the first connecting link and the first coupling link pivotably connected with each other at the second end portion of the first connecting link and the second end portion of the first coupling link, the second crank serving as the second pivotable joint link, the second crank and the second arm link pivotably connected with each other at the first end portion of second crank and the first pivotable joint portion of the second arm link, the second crank and the second coupling link integrally connected with each other at the first end portion of second crank and the first end portion of the second coupling link at an acute angle from each other, the second crank and the second retainer link pivotably connected with each other at the second end portion of the second crank and the first end portion of the second retainer link, the second connecting link and the first arm link pivotably connected with each other at the first end portion of the second connecting link and the first pivotable joint portion of the first arm link, the second connecting link and the second coupling link pivotably connected with each other at the second end portion of the second connecting link and the second end portion of the second coupling link, the first arm link integrally connected at the first end portion of the first arm link to the first driving shaft, the second arm link integrally connected at the first end portion of the second arm link to the second driving shaft.

11. A robot arm mechanism as set forth in claim 10 in which the sum of the lengths of the first coupling link and the first connecting link is greater than the sum of lengths between the first pivotable joint portions of the first and second arm links.

12. A robot arm mechanism as set forth in claim 10 in which the first connecting link further comprises a first connecting link and a first supporting link respectively having first and second end portions, the first supporting link substantially equal in length to the first coupling link, the first supporting link and the second arm link integrally connected with each other at the first end portion of the first supporting link and the first end portion of the second arm link at an acute angle from each other, the first supporting link and the first connecting link pivotably connected each other at the second end portion of the first supporting link and the first end portion of the first connecting link, the second connecting link further comprising a second connecting link and a second supporting link respectively having first and second end portions, the second supporting link substantially equal in length to the second coupling link, the second supporting link and the first arm link integrally connected with each other at the first end portion of the second supporting link and the first end portion of the first arm link at an acute angle from each other, the second supporting link and the second connecting link pivotably connected each other at the second end portion of the second supporting link and the first end portion of the second connecting link.

13. A robot arm mechanism as set forth in claim 7 in which the operating mechanism further comprises a first, second and third operating links respectively having first and second end portions and rotatable around the rotation axis, the third operating link positioned between the first and second operating links, the first operating link and the first arm link integrally connected with each at the first end portion of the first operating link and the first end portion of the first arm link, the second operating link and the second arm link integrally connected with each at the first end portion of the second operating link and the first end portions of the second arm link, the third operating link integrally connected at the first end portion of the third operating link to the first end portions of the first and second pivotable joint links, the coupling link having a third end portion between the first and second end portions of the coupling link, the first operating link and the crank pivotably connected with each other at the second end portion of the first operating link and the first end potion of the crank, the crank and the coupling link pivotably connected with each other at the second end portion of the crank and the first end portion of the coupling link, the coupling link and the connecting link pivotably connected with each other at the second end portion of the coupling link and the second end portion of the connecting link, the coupling link and the third operating link pivotably connected with each other at the third end portion of the coupling link and the second end portion of the third operating link, the first arm link integrally connected at the first end portion of the first arm link to the first driving shaft, the second arm link integrally connected at the first end portion of the second arm link to the second driving shaft.

14. A robot arm mechanism as set forth in claim 13 in which the coupling link is formed in a shape like a capital T.

15. A robot arm mechanism as set forth in claim 13 in which the first joint link serves as the second joint link.

16. A robot arm mechanism as set forth in claim 13 in which the first joint and second joint links are held at an acute angle from each other around the rotation axis.

17. A robot arm mechanism as set forth in claim 7 in which the robot arm further comprises a link operating mechanism including a first and second link operating mechanisms, the first link operating mechanism pivotably connected with the first arm link, the second link operating mechanism pivotably connected with the second arm link, the first link operating mechanism comprising a first lever member, a first connecting link, and a first long link respectively having first and second end portions, the first long link rotatable around the rotation axis, the first lever member comprising a first crank and a first coupling link respectively having first and second end portions, the second link operating mechanism comprising a second lever member, a second connecting link, and a second long link respectivelly having first and second end portions, the second long link rotatable around the rotation axis, the second lever member comprising a second crank and a second coupling link respectively having first and second end portions, the first crank and the first coupling link integrally connected with each other at the first end portion of the first crank and the first end portion of the first coupling link at an acute angle from each other, the first crank and the first arm link pivotably connected with each other at the first end portion of the first crank and the first pivotable joint portion of the first arm link, the first crank and the first retainer link pivotably connected with each other at the first end portion of the first crank and the first end portion of the first retainer crank, the first coupling link and the first connecting link pivotably connected with each other at the second end portion of the first coupling link and the first end portion of the first connecting link the first connecting link and the first long link pivotably connected with each other at the second end portion of the first connecting link and the second end portion of the first long link, the first and second long links integrally connected with each other at the first end portions of the first and second long links at an acute angle from each other, the second crank and the second coupling link integrally connected with each other at the first end portion of the second crank and the first end portion of the second coupling link at an acute angle from each other, the second crank and the second arm link pivotably connected with each other at the first end portion of the second crank and the first pivotable joint portion of the second arm link, the second crank and the second retainer link pivotably connected with each other at the second end portion of the second crank and the first end portion of the second retainer link, the second coupling link and the second connecting link pivotably connected with each other at the second end portion of the second coupling link and the first end portion of the second connecting link, the second connecting link and the second long link pivotably connected with each other at the second end portion of the second connecting link and the second end portion of the second long link, the first and second arm links integrally connected to the first driving shaft to be rotated around the rotation axis, the first and second long links integrally connected to the second driving shaft to be rotated around the rotation axis.

18. A robot arm mechanism as set forth in claim 7 which the robot arm further comprises:
a first and second handling support links having first and second end portions and substantially equal in length to the first and second output links, the first handling support link integrally connected at the first end portion of the first handling support link to the first handling member, the second handling support link integrally connected at the first end portion of the second handling support link to the first handling member;
a first and second additional arm linkages, the first additional linkage comprising a third and fourth arm links respectively having first and second end portions and substantially equal in length to each other, the third arm link and the first handling support link pivotably connected with each other at the first end portion of the third arm link and the first end portion of the first handling support link, the third arm link and the first arm link pivotably connected with each other at the second end portion of the third arm link and the second end portion of the first arm link, the third arm link and the first output link pivotably connected with each other at the second end portion of the third arm link and the first end portion of the first output link, the fourth arm link and the first handling support link pivotably connected with each other at the first end portion of the fourth arm link and the first end portion of the first handling support link, the fourth arm link and the first retainer link pivotably connected with each other at the second end portion of the fourth arm link and the second end portion of the first retainer link, the fourth arm link and the first output link pivotably connected with each other at the second end portion of the fourth arm link and the second end portion of the first output link, the second additional linkage comprising a fifth and sixth arm links respectively having first and second end portions and substantially equal in length to each other, the fifth arm link and the second handling support link pivotably connected with each other at the first end portion of the fifth arm link and the first end portion of the second handling support link, the fifth arm link and the second arm link pivotably connected with each other at the second end portion of the fifth arm link and the second end portion of the second arm link, the fifth arm link and the second output link pivotably connected with each other at the second end portion of the fifth arm link and the first end portion of the second output link, the sixth arm link and the second handling support link pivotably connected with each other at the second end portion of the sixth arm link and the first end portion of the second handling support link, the sixth arm link and the second retainer link pivotably connected with each other at the second end portion of the sixth arm link and the second end portion of the second retainer link, the sixth arm link and the second output link pivotably connected with each other at the second end portion of the sixth arm link and the second end portion of the second output link;
a synchronous mechanism comprising a first synchronous mechanism for rotating the first additional linkage with respect to the first arm link and the first retainer link, and a second synchronous mechanism for rotating the second additional linkage with respect to the second arm link and the second retainer link.

19. A robot arm mechanism as set forth in claim 18 in which the synchronous mechanism comprises a first double crank mechanism including a first link, a second link, a third link, and a fourth link respectively having first and second end portions, the second synchronous mechanism further comprising a second double crank mechanism including a fifth link, a sixth link, and a seventh link respectively having first and second end portions, the first double crank mechanism similar in figure to the second double crank mechanism except for working in the reverse direction, the first and second links substantially equal in length to each other, the third link longer than the first and second links, the fourth link made up of a part of the first arm link from the second end portion of the first arm link to the second pivotable joint portion, the fifth link and the sixth link equal in length to each other, the first link and the first output link integrally connected with each other at the first end portion of the first link and the first end portion of the first output link, the first link and the fourth link pivotably connected with each other at the first end portion of the first link and the first end portion of the fourth link, the first link and the fifth link pivotably connected with each other at the second end portion of the first link and the first end portion of the fifth link at an acute angle from each other, the second link and the first arm link pivotably connected with each other at the first end portion of the second link and the second pivotable joint portion of the first arm link, the second link and the third link pivotably connected with each other at the second end portion of the second link and the first end portion of the third link, the third link and the fifth link integrally connected with each other at the second end portion of the third link and the second end portion of the fifth link under the state that the third link is crossed with the first arm link, the first retainer link, the third link and the fourth arm link, the third link and the seventh link pivotably connected with each other at the second end portion of the third link and the first end portion of the seventh link, the fourth link and the first output link pivotably connected with each other at the second end portion of the fourth link and the first end portion of the first output link, the fourth link and the sixth link pivotably connected with each other at the second end portion of the fourth link and the first end portion of the sixth link, the sixth link and the seventh link pivotably connected with each other at the second end portion of the sixth link and the second end portion of the seventh link at an angle from each other under the state that the seventh link is crossed with the first link, the second synchronous mechanism comprising a second double crank mechanism including a eighth link, a ninth link, a tenth link, and a eleventh link respectively having first and second end portions, the second synchronous mechanism further comprising a fourth double crank mechanism including a twelfth link, a thirteenth link, and a fourteenth link respectively having first and second end portions, the twelfth link and the thirteenth link equal in length to each other, the eighth and ninth link substantially equal in length to each other, the tenth link longer than the eighth and ninth link, the eleventh link made up of a part of the second arm link from the second end portion of the second arm link to the second pivotable joint portion, the twelfth link and the thirteenth link equal in length to each other, the eighth link and the second output link integrally connected with each other at the first end portion of the eighth link and the first end portion of the second output link, the eighth link and the eleventh link pivotably connected with each other at the first end portion of the eighth link and the first end portion of the eleventh link, the eighth link and the twelfth link pivotably connected with each other at the second end portion of the eighth link and the first end portion of the twelfth link at an acute angle from each other the ninth link and the second arm link pivotably connected with each other at the first end portion of the ninth link and the second pivotable joint portion of the second arm link, the ninth link and the tenth link pivotably connected with each other at the second end portion of the ninth link and the first end portion of the tenth link, the tenth link and the twelfth link integrally connected with each other at the second end portion of the tenth link and the second end portion of the twelfth link under the state that the tenth link is crossed with the second arm link, the second retainer link, the tenth link and the eleventh link, the tenth link and the fourteenth link pivotably connected with each other at the second end portion of the tenth link and the first end portion of the fourteenth link, the eleventh link and the second output link pivotably connected with each other at the second end portion of the eleventh link and the first end portion of the second output link, the eleventh link and the thirteenth link pivotably connected with each other at the second end portion of the eleventh link and the first end portion of the thirteenth link, the thirteenth link and the fourteenth link pivotably connected with each other at the second end portion of the thirteenth link and the second end portion of the fourteenth link at an angle of from each other under the state that fourteenth link is crossed with the eighth link.

20. A robot arm mechanism as set forth in claim 7 in which the first and second driving shafts are able to be drive the first and second arms be to rotated at the same speed and in the same rotation direction whereby the first and second arms are rotated under a state such that the first and second arms are united together.

21. A robot arm mechanism as set forth in claim 7 in which the second and third rotation axis are in coaxial relationship with the rotation axis and the first and second driving shafts are rotatable independently of each other.

* * * * *